US011677009B2

(12) United States Patent
Shimizu

(10) Patent No.: US 11,677,009 B2
(45) Date of Patent: Jun. 13, 2023

(54) SEMICONDUCTOR DEVICE, METHOD FOR MANUFACTURING SEMICONDUCTOR DEVICE, INVERTER CIRCUIT, DRIVING DEVICE, VEHICLE, AND ELEVATOR

(71) Applicant: KABUSHIKI KAISHA TOSHIBA, Tokyo (JP)

(72) Inventor: Tatsuo Shimizu, Shinagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 17/734,401

(22) Filed: May 2, 2022

(65) Prior Publication Data

US 2022/0262916 A1 Aug. 18, 2022

Related U.S. Application Data

(62) Division of application No. 16/992,242, filed on Aug. 13, 2020, now Pat. No. 11,355,612.

(30) Foreign Application Priority Data

Mar. 13, 2020 (JP) .............................. JP2020-044567

(51) Int. Cl.
*H01L 21/04* (2006.01)
*H01L 29/45* (2006.01)
(Continued)

(52) U.S. Cl.
CPC ............ *H01L 29/45* (2013.01); *H01L 21/046* (2013.01); *H01L 21/0485* (2013.01);
(Continued)

(58) Field of Classification Search
CPC ..... H01L 21/04; H01L 21/046; H01L 21/048; H01L 21/0485; H01L 29/16;
(Continued)

(56) References Cited

U.S. PATENT DOCUMENTS 10,249,718 B2 4/2019 Shimizu et al.
2009/0072244 A1 3/2009 Harada et al.
(Continued)

FOREIGN PATENT DOCUMENTS

JP 2003-243323 A 8/2003
JP 3871607 B2 1/2007
(Continued)

*Primary Examiner* — Fazli Erdem
(74) *Attorney, Agent, or Firm* — Oblon, McClelland, Maier & Neustadt, L.L.P.

(57) ABSTRACT

A semiconductor device of an embodiment includes: a silicon carbide layer including a first silicon carbide region of n-type containing one metal element selected from a group consisting of nickel (Ni), palladium (Pd), platinum (Pt), and chromium (Cr) and a second silicon carbide region of p-type containing the metal element; and a metal layer electrically connected to the first silicon carbide region and the second silicon carbide region. Among the metal elements contained in the first silicon carbide region, a proportion of the metal element positioned at a carbon site is higher than a proportion of the metal element positioned at an interstitial position. Among the metal elements contained in the second silicon carbide region, a proportion of the metal element positioned at an interstitial position is higher than a proportion of the metal element positioned at a carbon site.

11 Claims, 27 Drawing Sheets

(51) Int. Cl.
  *H01L 29/16* (2006.01)
  *H01L 29/78* (2006.01)
  *H01L 29/66* (2006.01)
  *B61C 3/00* (2006.01)
  *H02P 27/06* (2006.01)
  *B66B 11/04* (2006.01)
  *B60L 50/51* (2019.01)

(52) U.S. Cl.
  CPC .... *H01L 29/1608* (2013.01); *H01L 29/66068* (2013.01); *H01L 29/7802* (2013.01); *H01L 29/7813* (2013.01); *B60L 50/51* (2019.02); *B61C 3/00* (2013.01); *B66B 11/043* (2013.01); *H02P 27/06* (2013.01)

(58) Field of Classification Search
  CPC ..... H01L 29/1608; H01L 29/45; H01L 29/66; H01L 29/66068; H01L 29/78; H01L 29/7802; H01L 29/7813
  USPC .......................................................... 257/77
  See application file for complete search history.

(56) References Cited

U.S. PATENT DOCUMENTS

| | | |
|---|---|---|
| 2015/0236099 A1 | 8/2015 | Shimizu |
| 2018/0308935 A1 | 10/2018 | Shimizu |
| 2018/0308936 A1 | 10/2018 | Shimizu et al. |
| 2018/0323261 A1 | 11/2018 | Kawai et al. |
| 2021/0288147 A1 | 9/2021 | Shimizu |

FOREIGN PATENT DOCUMENTS

| | | |
|---|---|---|
| JP | 2007-242744 A | 9/2007 |
| JP | 2013-058668 A | 3/2013 |
| JP | 2017-199807 A | 11/2017 |
| JP | 2018-082190 A | 5/2018 |
| JP | 2018-186125 A | 11/2018 |
| JP | 2018-186126 A | 11/2018 |
| JP | 2021-145111 A | 9/2021 |

SEMICONDUCTOR DEVICE, METHOD FOR MANUFACTURING SEMICONDUCTOR DEVICE, INVERTER CIRCUIT, DRIVING DEVICE, VEHICLE, AND ELEVATOR

CROSS-REFERENCE TO RELATED APPLICATION

This application is a divisional of U.S. application Ser. No. 16/992,242 filed Aug. 13, 2020, and which is based upon and claims the benefit of priority from Japanese Patent Application No. 2020-044567, filed on Mar. 13, 2020, the entire contents of each of which are incorporated herein by reference.

FIELD

Embodiments described herein relate generally to a semiconductor device, a method for manufacturing a semiconductor device, an inverter circuit, a driving device, a vehicle, and an elevator.

BACKGROUND

Silicon carbide (SiC) has been expected as a material for next generation semiconductor devices. As compared with silicon (Si), silicon carbide has superior physical properties that a band gap is about three times of that of Si, a breakdown field strength is about ten times of that of Si, and a thermal conductivity is about three times of that of Si. These characteristics are used to achieve a semiconductor device capable of operating with a low loss at high temperature.

In a device using silicon carbide, it is desired to reduce the contact resistance between a silicon carbide layer and a metal electrode in order to improve device characteristics. In particular, it is desired to simultaneously reduce both the contact resistance between an n-type silicon carbide region and the metal electrode and the contact resistance between a p-type silicon carbide region and the metal electrode.

DETAILED DESCRIPTION

Figure 1:
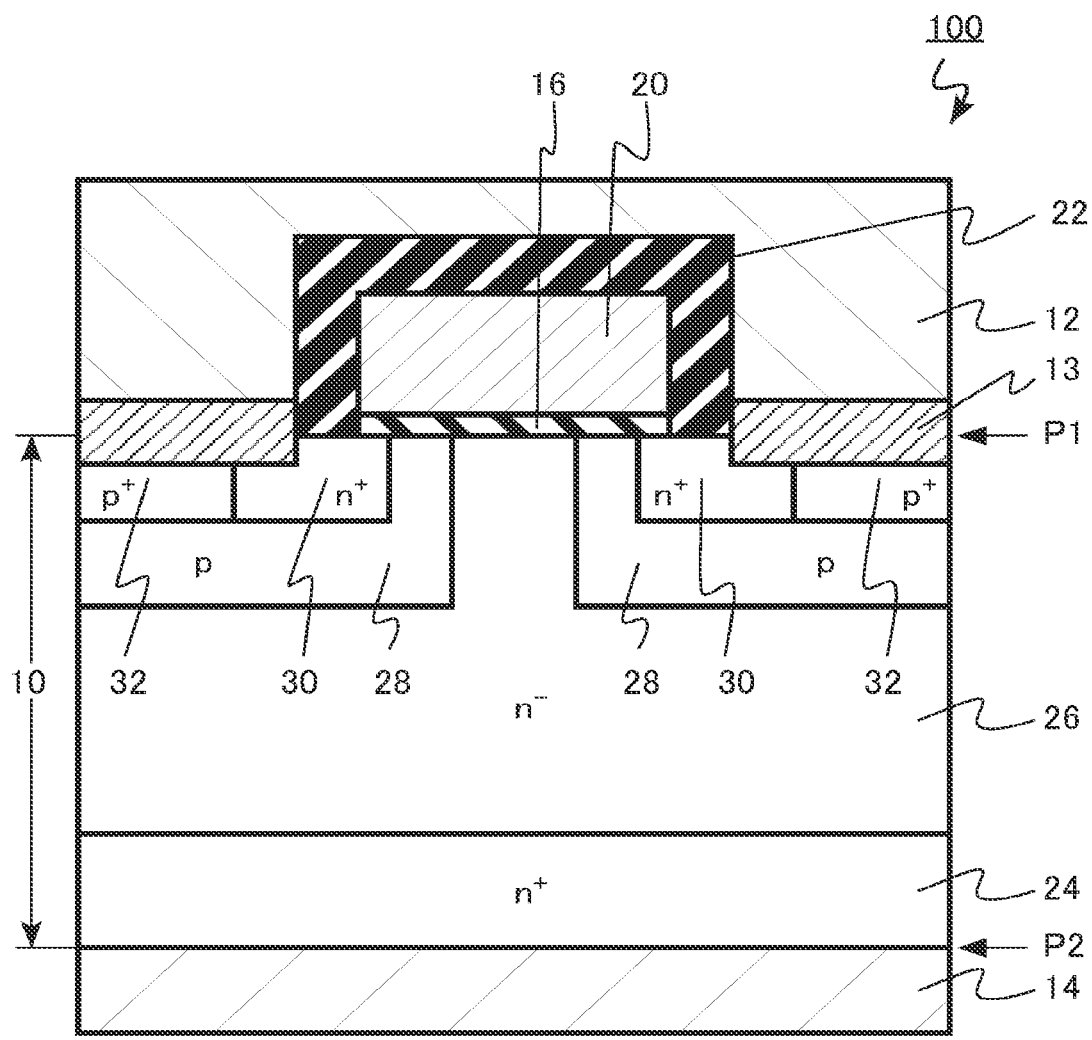
FIG. 1 is a schematic cross-sectional view of a semiconductor device of a first embodiment.

A semiconductor device of an embodiment includes: a silicon carbide layer including a first silicon carbide region of n-type containing one metal element selected from a group consisting of nickel (Ni), palladium (Pd), platinum (Pt), and chromium (Cr) and a second silicon carbide region of p-type containing the metal element; and a metal layer electrically connected to the first silicon carbide region and the second silicon carbide region. Among the metal elements contained in the first silicon carbide region, a proportion of the metal element positioned at a carbon site of a crystal structure of silicon carbide is higher than a proportion of the metal element positioned at an interstitial position of the crystal structure of the silicon carbide. Among the metal elements contained in the second silicon carbide region, a proportion of the metal element positioned at an interstitial position of a crystal structure of silicon carbide is higher than a proportion of the metal element positioned at a carbon site of the crystal structure of the silicon carbide.

Hereinafter, embodiments of the present disclosure will be described with reference to the drawings. In the following description, the same or equivalent members and the like will be denoted by the same reference numerals, and members that have been once described will not be described as appropriate.

In the following description, notations $n^+$, $n$, $n^-$, $p^+$, $p$, and $p^-$ indicate relative levels of impurity concentration in each conductivity type. That is, $n^+$ indicates an n-type impurity concentration higher than that of n, and $n^-$ indicates an n-type impurity concentration lower than that of n. In addition, $p^+$ indicates a p-type impurity concentration higher than that of p, and $p^-$ indicates a p-type impurity concentration lower than that of p. In some cases, an $n^+$-type and an $n^-$-type are simply referred to as an n-type, and a $p^+$-type and a $p^-$-type are simply referred to as a p-type. Unless otherwise specified, the impurity concentration of each region is represented by, for example, a value of an impurity concentration at the center of each region.

The impurity concentration can be measured by secondary ion mass spectrometry (SIMS), for example. In addition, a relative level of the impurity concentration can also be determined based on a level of a carrier concentration obtained by, for example, scanning capacitance microscopy (SCM). In addition, a distance such as a width and a depth of an impurity region can be obtained by SIMS, for example. In addition, a distance such as a width and a depth of an impurity region can be obtained from an SCM image, for example.

A depth of a trench, a thickness of an insulating layer, and the like can be measured on an image of SIMS or a transmission electron microscope (TEM), for example.

A magnitude relationship among a proportion of the metal element in the silicon carbide layer positioned at a silicon site of the crystal structure of the silicon carbide, a proportion of the metal element in the silicon carbide layer positioned at the carbon site of the crystal structure of the silicon carbide, and a proportion of the metal element in the silicon carbide layer positioned at an interstitial position of the crystal structure of the silicon carbide can be determined using, for example, Raman spectroscopy or X-ray Photoelectron Spectroscopy (XPS).

For example, X-ray photoelectron spectroscopy (XPS), infrared spectroscopy, or Raman spectroscopy is used to identify silicide phases existing in a metal silicide layer and to determine a magnitude relationship of the amount of the silicide phases existing in the metal silicide layer.

First Embodiment

A semiconductor device of a first embodiment includes: a silicon carbide layer including a first silicon carbide region of n-type containing one metal element selected from a group consisting of nickel (Ni), palladium (Pd), platinum (Pt), and chromium (Cr) and a second silicon carbide region of p-type containing the metal element; and a metal layer electrically connected to the first silicon carbide region and the second silicon carbide region. Among the metal elements contained in the first silicon carbide region, a proportion of the metal element positioned at a carbon site of a crystal structure of silicon carbide is higher than a proportion of the metal element positioned at an interstitial position of the crystal structure of the silicon carbide. Among the metal elements contained in the second silicon carbide region, a proportion of the metal element positioned at an interstitial position of a crystal structure of silicon carbide is higher than a proportion of the metal element positioned at a carbon site of the crystal structure of the silicon carbide.

FIG. 1 is a schematic cross-sectional view of the semiconductor device of the first embodiment. The semiconductor device of the first embodiment is a vertical MOSFET 100. The MOSFET 100 is an n-channel transistor that uses electrons as carriers.

The MOSFET 100 includes a silicon carbide layer 10, a source electrode 12 (metal layer), a metal silicide layer 13 (conductive layer), a drain electrode 14, a gate insulating layer 16, a gate electrode 20, and an interlayer insulating layer 22.

The source electrode 12 is an example of the metal layer. The metal silicide layer 13 is an example of the conductive layer.

The silicon carbide layer 10 includes a drain region 24, a drift region 26, a p-well region 28, a source region 30 (first silicon carbide region), and a p-well contact region 32 (second silicon carbide region).

The silicon carbide layer 10 is a single crystal of, for example, a 4H-SiC. The silicon carbide layer 10 has a first plane P1 and a second plane P2. The second plane P2 faces the first plane P1. The first plane P1 is a front surface of the silicon carbide layer 10, and the second plane P2 is a back surface of the silicon carbide layer 10.

In the first embodiment, a "depth" means a depth when the first plane P1 is set as a reference. Here, the first plane P1 is a virtual plane including an interface between the silicon carbide layer 10 and the gate insulating layer 16.

Hereinafter, a description will be given by exemplifying a case where the first plane P1 of the silicon carbide layer 10 is a plane inclined by 0° or more and 10° or less with respect to the silicon face, and the second plane P2 is a plane inclined by 0° or more and 10° or less with respect to the carbon face. The first plane P1 of the silicon carbide layer 10 has an off-angle of 0° or more and 10° or less with respect to the silicon face.

The drain region 24 is $n^+$-type SiC. The drain region 24 contains, for example, nitrogen (N) as an n-type impurity. An n-type impurity concentration of the drain region 24 is, for example, $1 \times 10^{18}$ cm$^{-3}$ or more and $1 \times 10^{21}$ cm$^{-3}$ or less.

The drift region 26 is $n^-$-type SiC. The drift region 26 is positioned between the drain region 24 and the first plane P1. A part of the drift region 26 is in contact with the first plane P1.

The drift region 26 contains, for example, nitrogen (N) as an n-type impurity. An n-type impurity concentration of the drift region 26 is, for example, $1 \times 10^{15}$ cm$^{-3}$ or more and $2 \times 10^{16}$ cm$^{-3}$ or less. The n-type impurity concentration of the drift region 26 is lower than the n-type impurity concentration of the drain region 24.

The drift region 26 is, for example, an SiC epitaxial growth layer formed on the drain region 24 by epitaxial growth. A thickness of the drift region 26 is, for example, 5 µm or more and 100 µm or less.

The p-well region 28 is p-type SiC. The p-well region 28 is positioned between the drift region 26 and the first plane P1. A part of the p-well region 28 is in contact with the first plane P1.

The p-well region 28 contains, for example, aluminum (Al) as a p-type impurity. A p-type impurity concentration of the p-well region 28 is, for example, $1\times10^{16}$ cm$^{-3}$ or more and $1\times10^{10}$ cm$^{-3}$ or less.

A depth of the p-well region 28 is, for example, 0.4 μm or more and 0.8 μm or less. The p-well region 28 functions as a channel region of the MOSFET 100.

The source region 30 is n$^+$-type SiC. The source region 30 is positioned between the p-well region 28 and the first plane P1. A part of the source region 30 is in contact with the first plane P1. The source region 30 extends in a first direction.

The source region 30 contains phosphorus (P) or nitrogen (N) as an n-type impurity. An n-type impurity concentration of the source region 30 is, for example, $1\times10^{18}$ cm$^{-3}$ or more and $1\times10^{22}$ cm$^{-3}$ or less. The n-type impurity concentration of the source region 30 is higher than the n-type impurity concentration of the drift region 26.

A depth of the source region 30 is shallower than the depth of the p-well region 28. The depth of the source region 30 is, for example, 0.1 μm or more and 0.4 μm or less.

The source region 30 contains one metal element (M) selected from the group consisting of nickel (Ni), palladium (Pd), platinum (Pt), and chromium (Cr). A concentration of the metal element (M) in the source region is, for example, $1\times10^{18}$ cm$^{-3}$ or more and $1\times10^{21}$ cm$^{-3}$ or less.

Among the metal elements (M) contained in the source region 30, the proportion of the metal element (M) positioned at the carbon site of the crystal structure of the silicon carbide is higher than the proportion of the metal element (M) positioned at an interstitial position of the crystal structure of the silicon carbide.

The p-well contact region 32 is p$^+$-type SiC. The p-well contact region 32 is positioned between the p-well region 28 and the first plane P1. The p-well contact region 32 is adjacent to the source region 30. The p-well contact region 32 is in contact with the source region 30.

The p-well contact region 32 contains, for example, aluminum as a p-type impurity. A p-type impurity concentration of the p-well contact region 32 is, for example, $1\times10^{18}$ cm$^{-3}$ or more and $1\times10^{22}$ cm$^{-3}$ or less. The p-type impurity concentration of the p-well contact region 32 is higher than the p-type impurity concentration of the p-well region 28.

A depth of the p-well contact region 32 is shallower than the depth of the p-well region 28. The depth of the p-well contact region 32 is, for example, 0.1 μm or more and 0.4 μm or less The p-well contact region 32 contains one metal element (M) selected from the group consisting of nickel (Ni), palladium (Pd), platinum (Pt), and chromium (Cr). A concentration of the metal element (M) in the p-well contact region 32 is, for example, $1\times10^{18}$ cm$^{-3}$ or more and $1\times10^{21}$ cm$^{-3}$ or less.

Among the metal elements (M) contained in the p-well contact region 32, the proportion of the metal element (M) positioned at an interstitial position of the crystal structure of the silicon carbide is higher than the proportion of the metal element (M) positioned at the carbon site of the crystal structure of the silicon carbide.

The gate insulating layer 16 is positioned between the silicon carbide layer 10 and the gate electrode 20. The gate insulating layer 16 is positioned between the p-well region 28 and the gate electrode 20.

The gate insulating layer 16 is, for example, an oxide or an oxynitride. The gate insulating layer 16 is, for example, silicon oxide. A thickness of the gate insulating layer 16 is, for example, 30 nm or more and 100 nm or less.

The gate insulating layer 16 and the p-well region 28 are in contact with each other. The p-well region 28 near the gate insulating layer 16 serves as the channel region of the MOSFET 100.

The gate electrode 20 is positioned on the first plane P1 side of the silicon carbide layer 10. The gate electrode 20 is provided on the gate insulating layer 16. The gate electrode 20 sandwiches the gate insulating layer 16 with the drift region 26, the source region 30, and the p-well region 28.

The gate electrode 20 is a conductor. The gate electrode 20 is, for example, polycrystalline silicon containing an n-type impurity or a p-type impurity. The gate electrode 20 may be metal, for example, titanium nitride, tungsten nitride, tungsten, aluminum, copper, ruthenium, cobalt, nickel, a cobalt silicide, a nickel silicide, or the like. The gate electrode 20 may have a stacked structure including any one kind of the above-described metal and polycrystalline silicon containing an n-type impurity or a p-type impurity.

The interlayer insulating layer 22 is formed on the gate electrode 20. The interlayer insulating layer 22 electrically separates the gate electrode 20 and the source electrode 12. The interlayer insulating layer 22 is, for example, silicon oxide.

The source electrode 12 is positioned on the first plane P1 side of the silicon carbide layer 10. The source electrode 12 is electrically connected to the source region 30 and the p-well contact region 32. The source electrode 12 also functions as a p-well electrode that applies an electric potential to the p-well region 28. The source electrode 12 is in contact with the metal silicide layer 13.

The source electrode 12 contains metal. The source electrode 12 is, for example, aluminum, an aluminum alloy, tungsten, or copper.

The source electrode 12 may include, for example, a barrier metal film (not illustrated) between the source electrode 12 and the metal silicide layer 13. The barrier metal film is, for example, titanium or titanium nitride.

The metal silicide layer 13 is provided between the silicon carbide layer 10 and the source electrode 12. The metal silicide layer 13 is an example of the conductive layer. The metal silicide layer 13 is in contact with the silicon carbide layer 10. The metal silicide layer 13 is in contact with the source electrode 12.

The metal silicide layer 13 contains, for example, a silicide of one metal element (M) selected from the group consisting of nickel (Ni), palladium (Pd), platinum (Pt), and chromium (Cr). The metal silicide layer 13 contains a nickel silicide, a palladium silicide, a platinum silicide, or a chromium silicide. The metal silicide layer 13 is, for example, a nickel silicide, a palladium silicide, a platinum silicide, or a chromium silicide.

A thickness of the metal silicide layer 13 in a direction normal to the first plane P1 of the silicon carbide layer 10 is, for example, 50 nm or more and 500 nm or less.

The drain electrode 14 is positioned on the second plane P2 side of the silicon carbide layer 10. The drain electrode 14 is in contact with the drain region 24. The drain electrode 14 is electrically connected to the drain region 24.

The drain electrode 14 is, for example, nickel. Nickel may react with the silicon carbide layer 10 to form a nickel silicide. The nickel silicide is, for example, NiSi or Ni$_2$Si.

Next, an example of a method for manufacturing the semiconductor device of the first embodiment will be described.

A method for manufacturing the semiconductor device of the first embodiment includes: ion-implanting an n-type impurity into a first region of a silicon carbide layer;

ion-implanting a p-type impurity into a second region of the silicon carbide layer; performing a first heat treatment to activate the n-type impurity and the p-type impurity; performing a first treatment to increase carbon vacancies in the first region; performing a second treatment to decrease carbon vacancies in the second region; forming a first metal film on the silicon carbide layer, the first metal film containing one metal element selected from a group consisting of nickel (Ni), palladium (Pd), platinum (Pt), and chromium (Cr); performing a second heat treatment to cause the silicon carbide layer to react with the first metal film at a temperatures lower than 900° C. to form a metal silicide layer containing the metal element; and forming a second metal film having a chemical composition different from a chemical composition of the first metal film on the silicon carbide layer.

Figure 2:
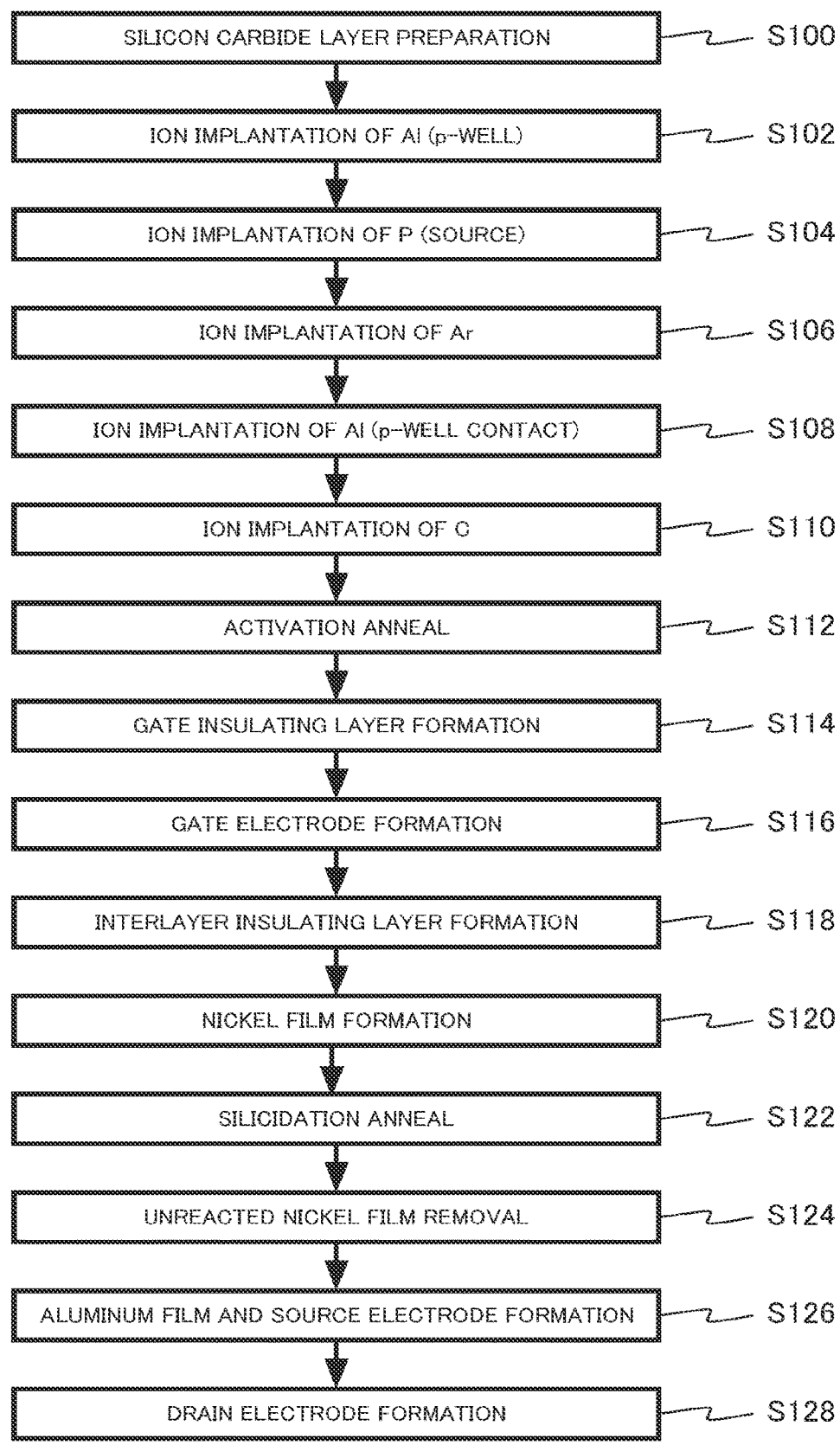
FIG. 2 is a flowchart of a process exemplifying a method for manufacturing the semiconductor device of the first embodiment.

FIG. 2 is a flowchart of a process exemplifying the method for manufacturing the semiconductor device of the first embodiment; FIGS. 3, 4, 5, 6, 7, 8, 9, 10, 11, 12, 13, 14, and 15 are schematic cross-sectional views illustrating the method for manufacturing the semiconductor device of the first embodiment. FIGS. 3, 4, 5, 6, 7, 8, 9, 10, 11, 12, 13, 14, and 15 illustrate the cross section corresponding to FIG. 1.

Hereinafter, a case where the metal element (M) is nickel (Ni) will be described as an example.

As illustrated in FIG. 2, the method for manufacturing the semiconductor device includes: silicon carbide layer preparation (Step S100); ion implantation of Al (Step S102); ion implantation of P (Step S104); ion implantation of Ar (Step S106); ion implantation of Al (Step S108); ion implantation of C (Step S110); activation anneal (Step S112); gate insulating layer formation (Step S114); gate electrode formation (Step S116); interlayer insulating layer formation (Step S118); nickel film formation (Step 3120); silicidation anneal (Step 3122); unreacted nickel film removal (Step S124); aluminum film and source electrode formation (Step S126); and drain electrode formation (Step S128).

Figure 3:
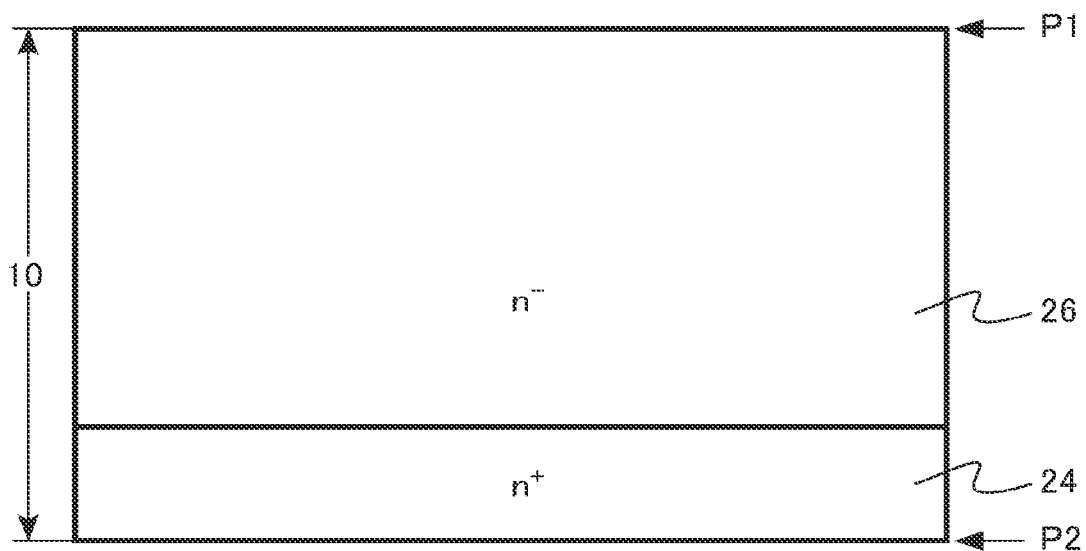
FIG. 3 is a schematic cross-sectional view illustrating a method for manufacturing the semiconductor device of the first embodiment.

In Step S100, the silicon carbide layer 10 is prepared (FIG. 3). The silicon carbide layer 10 includes the n$^+$-type drain region 24 and the n$^-$-type drift region 26. The drift region 26 is formed, for example, on the n$^+$-type drain region 24 by an epitaxial growth method. The silicon carbide layer 10 has a first plane P1 and a second plane P2.

Figure 4:
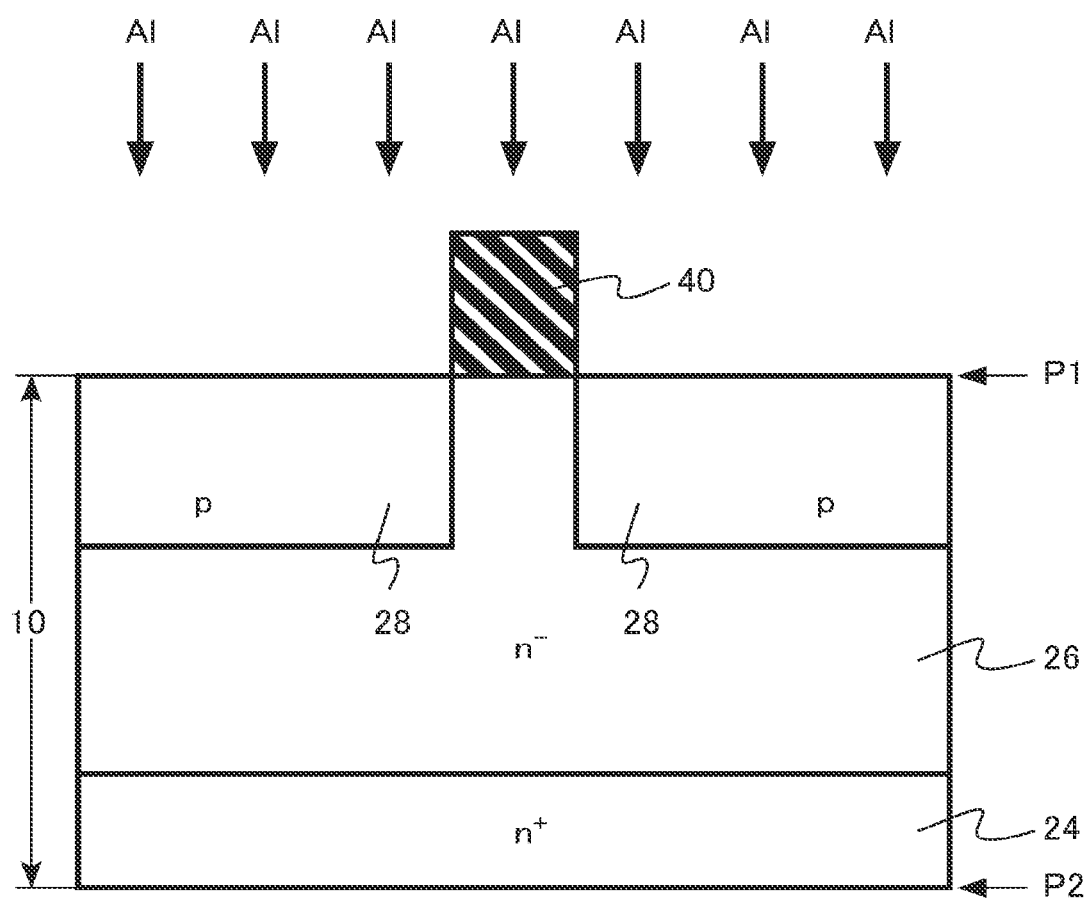
FIG. 4 is a schematic cross-sectional view illustrating the method for manufacturing the semiconductor device of the first embodiment.

Next, a first mask material 40 made of, for example, silicon oxide is formed by patterning using photolithography and etching. In Step S102, aluminum (Al) as the p-type impurity is ion-implanted into the drift region 26 using the first mask material 40 as an ion implantation mask, thereby forming the p-well region 28 (FIG. 4).

Figure 5:
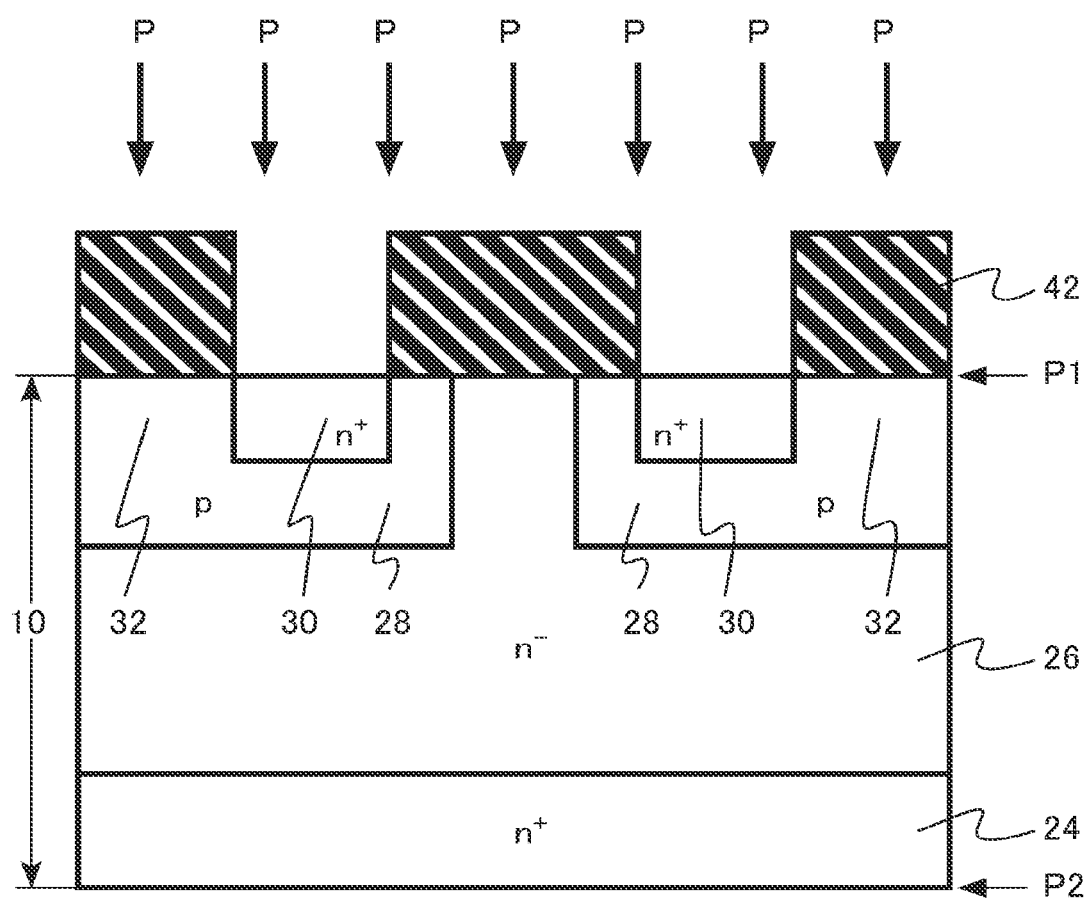
FIG. 5 is a schematic cross-sectional view illustrating the method for manufacturing the semiconductor device of the first embodiment.

Next, a second mask material 42 made of, for example, silicon oxide is formed by patterning using photolithography and etching. In Step S104, phosphorus (P) as the n-type impurity is ion-implanted into the p-well region 28 using the second mask material 42 as an ion implantation mask, thereby forming the source region 30 (FIG. 5). A region where the source region 30 is formed is an example of the first region.

Figure 6:
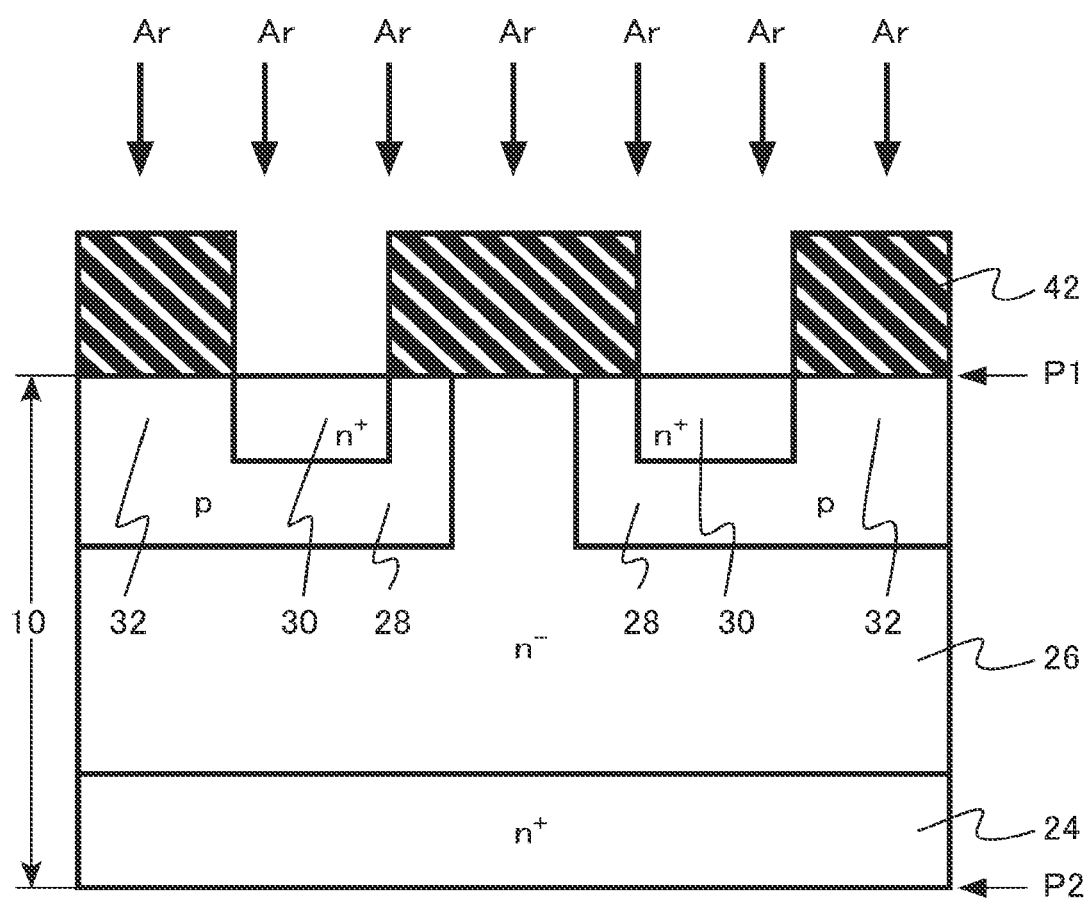
FIG. 6 is a schematic cross-sectional view illustrating the method for manufacturing the semiconductor device of the first embodiment.

In Step S106, argon (Ar) is ion-implanted into the source region 30 using the second mask material 42 as an ion implantation mask (FIG. 6). The ion implantation of argon into the source region 30 is an example of the first treatment to increase carbon vacancies in the first region. With the ion implantation of argon, the bonding of the silicon carbide in the source region 30 is broken and the carbon vacancies in the source region 30 increase.

Figure 7:
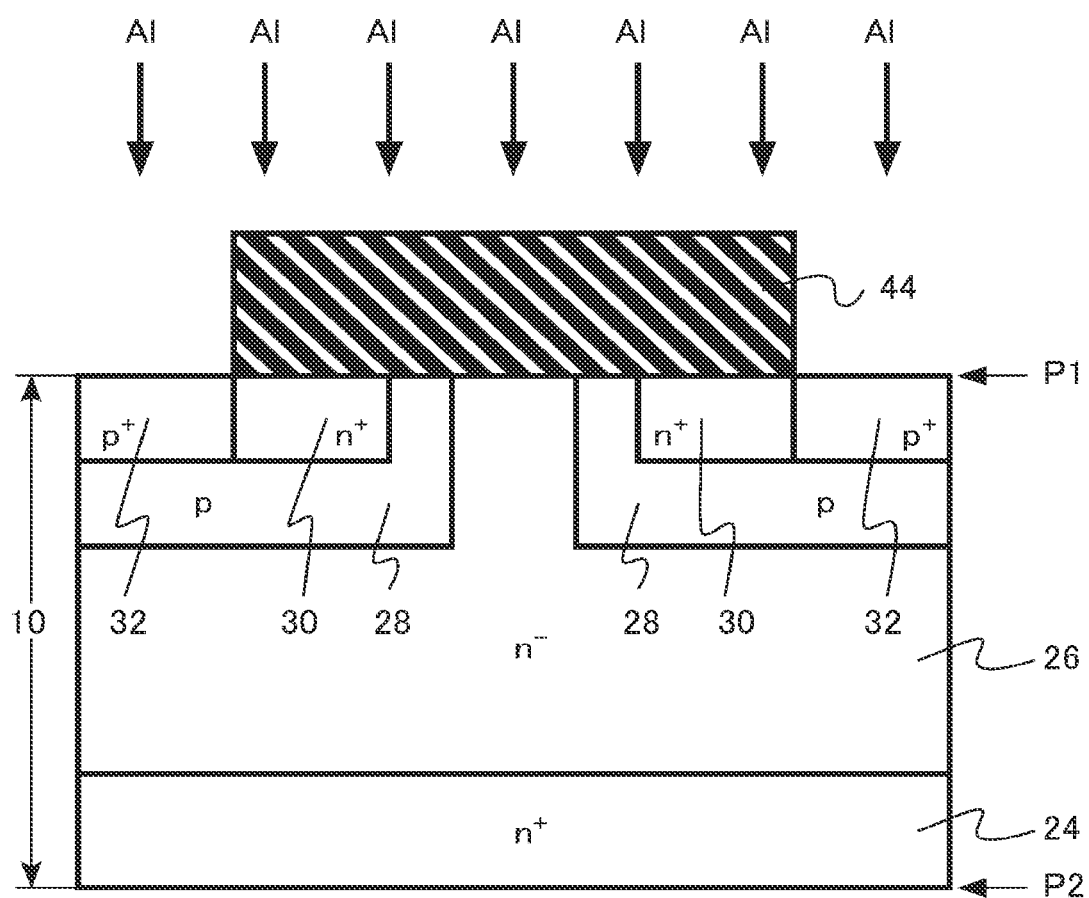
FIG. 7 is a schematic cross-sectional view illustrating the method for manufacturing the semiconductor device of the first embodiment.

Next, a third mask material 44 made of, for example, silicon oxide is formed by patterning using photolithography and etching. In Step S108, aluminum (Al) is ion-implanted into the p-well region 28 using the third mask material 44 as an ion implantation mask, thereby forming the p-well contact region 32 (FIG. 7). A region where the p-well contact region 32 is formed is an example of the second region.

Figure 8:
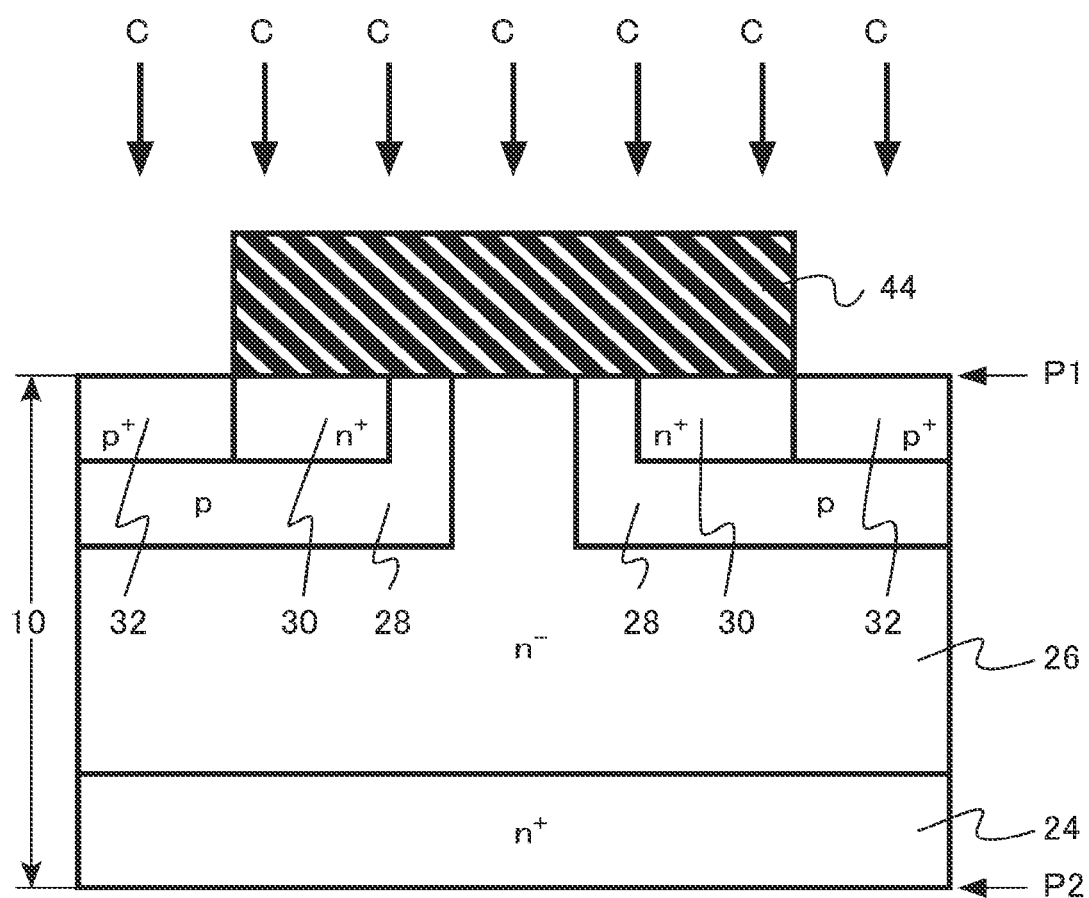
FIG. 8 is a schematic cross-sectional view illustrating the method for manufacturing the semiconductor device of the first embodiment.

In Step S110, carbon (C) is ion-implanted into the p-well contact region 32 using the third mask material 44 as an ion implantation mask (FIG. 8). The ion implantation of carbon into the p-well contact region 32 is an example of the second treatment to decrease carbon vacancies in the second region. With the ion implantation of carbon, the carbon vacancies in the p-well contact region 32 are filled with carbon, and the carbon vacancies decrease.

Figure 9:
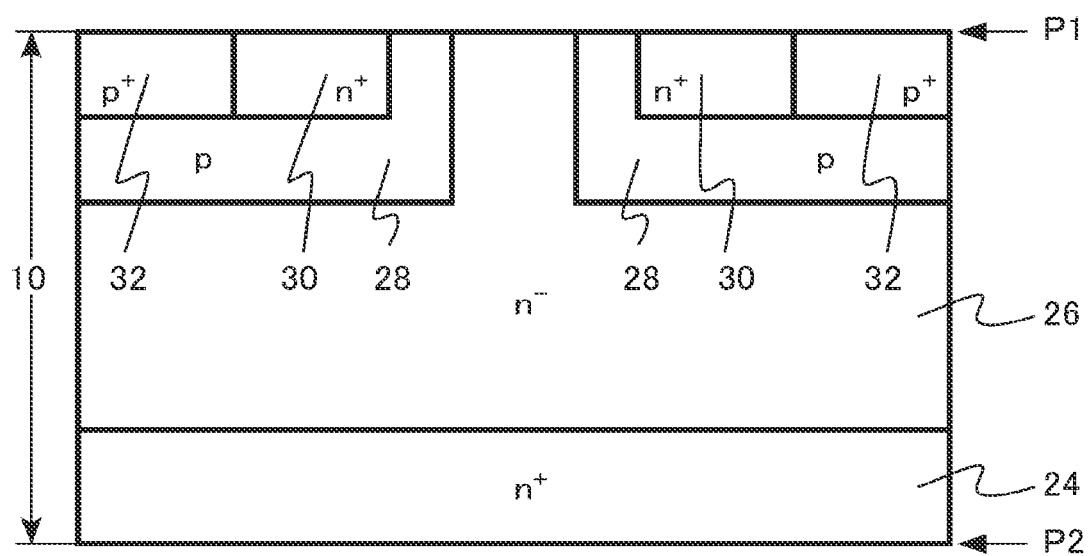
FIG. 9 is a schematic cross-sectional view illustrating the method for manufacturing the semiconductor device of the first embodiment.

In Step S112, activation anneal is performed (FIG. 9). The activation anneal activates the p-type impurities in the p-well region 28 and the p-well contact region 32 and the n-type impurities in the source region 30. The activation anneal is an example of the first heat treatment.

The activation anneal is performed, for example, in an atmosphere containing argon (Ar). The activation anneal is performed, for example, in an inert gas atmosphere such as an argon (Ar) gas. A temperature of the activation anneal is, for example, 1600° C. or higher and 2000° C. or lower.

Figure 10:
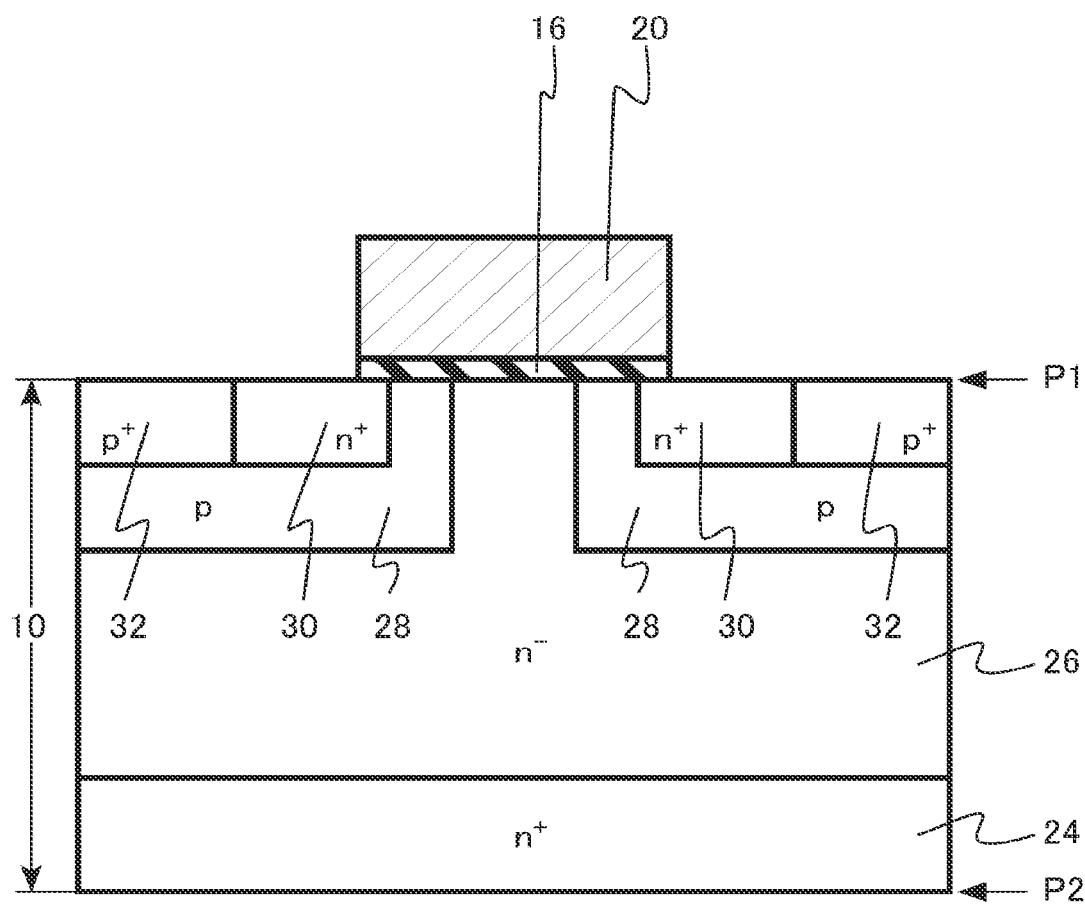
FIG. 10 is a schematic cross-sectional view illustrating the method for manufacturing the semiconductor device of the first embodiment.

In Step S114, the gate insulating layer 16, made of a silicon oxide film, for example, is formed by a chemical vapor deposition method (CVD method) or a thermal oxidation method. Then, the gate electrode 20, made of polycrystalline silicon, for example, is formed on the gate insulating layer 16 in Step S116 (FIG. 10).

Figure 11:
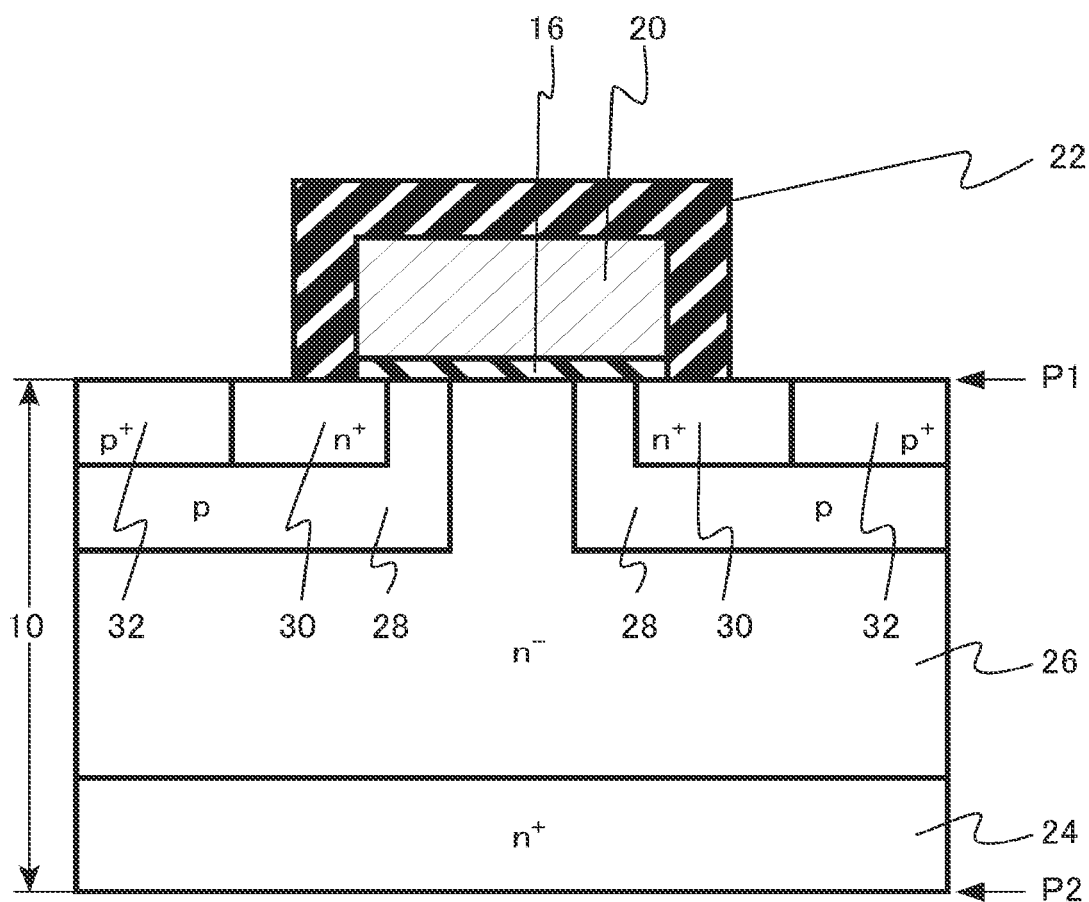
FIG. 11 is a schematic cross-sectional view illustrating the method for manufacturing the semiconductor device of the first embodiment.

In Step S118, the interlayer insulating layer 22, made of a silicon oxide film, for example, is formed on the gate electrode 20 (FIG. 11).

Figure 12:
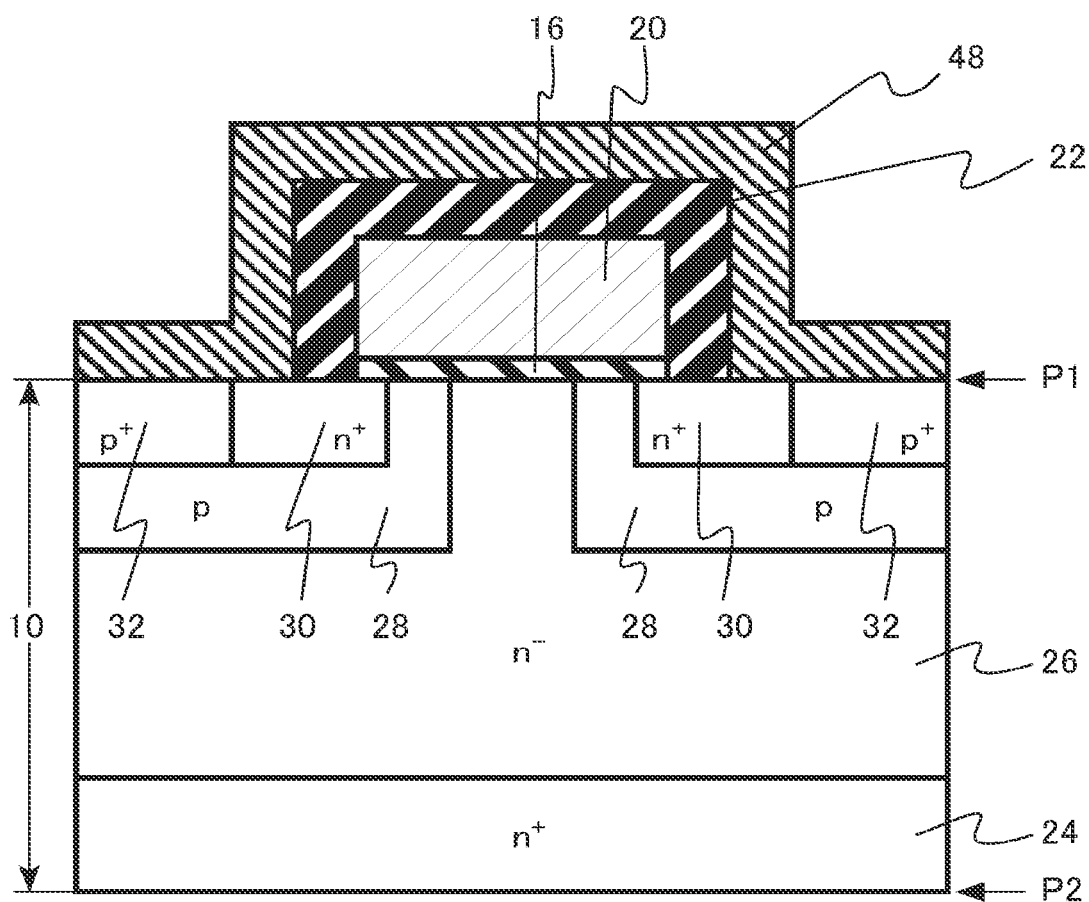
FIG. 12 is a schematic cross-sectional view illustrating the method for manufacturing the semiconductor device of the first embodiment.

In Step S120, the nickel film 48 is formed on the silicon carbide layer 10 (FIG. 12). The nickel film 48 is an example of the first metal film. The nickel film 48 is formed using, for example, a sputtering method.

Figure 13:
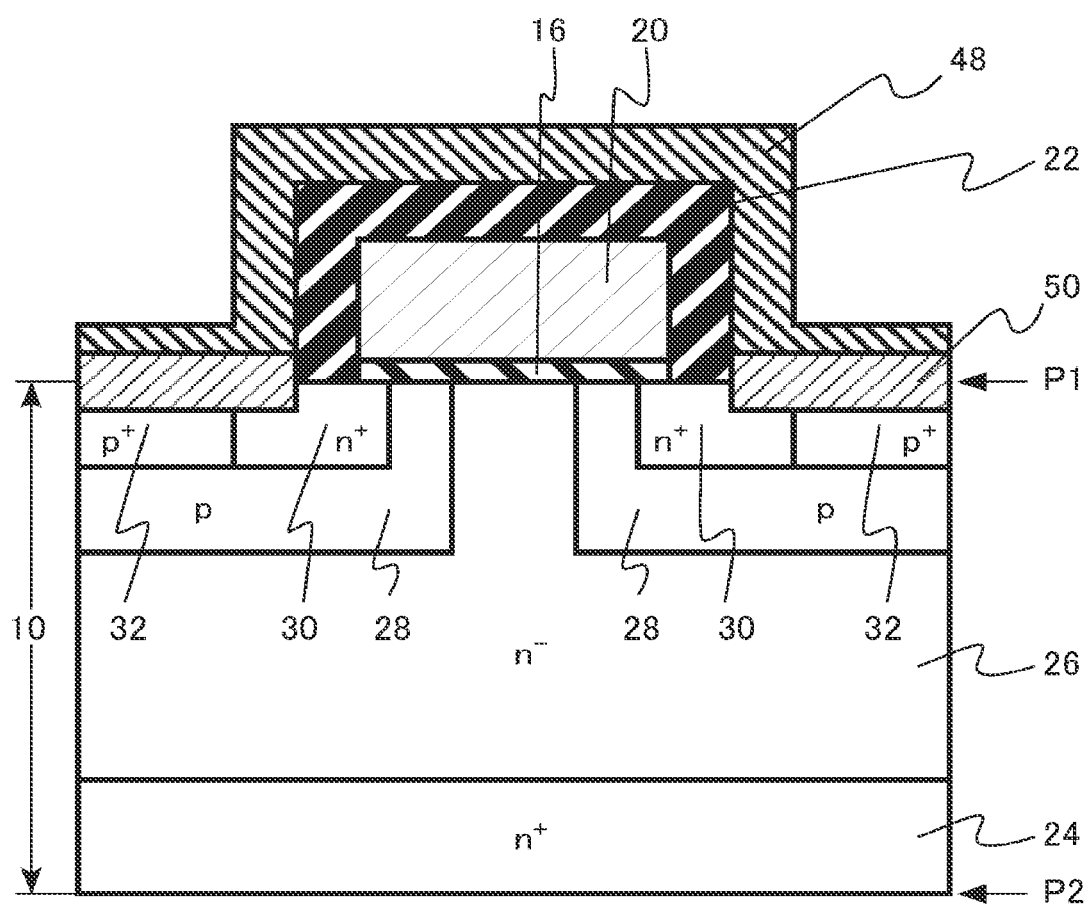
FIG. 13 is a schematic cross-sectional view illustrating the method for manufacturing the semiconductor device of the first embodiment.

In Step S122, silicidation anneal is performed. The silicidation anneal causes the silicon carbide layer 10 to react with the nickel film 48 to form a nickel silicide layer 50 (FIG. 13). The nickel silicide layer 50 is an example of the metal silicide layer 13.

The silicidation anneal is performed, for example, in an atmosphere containing nitrogen. The silicidation anneal is performed, for example, in an atmosphere containing a nitrogen gas. A temperature of the silicidation anneal is, for example, 500° C. or higher and lower than 900° C.

Nickel diffuses from the nickel film 48 into the silicon carbide layer 10 during the silicidation anneal. Nickel diffuses into the source region 30 and the p-well contact region 32.

Figure 14:
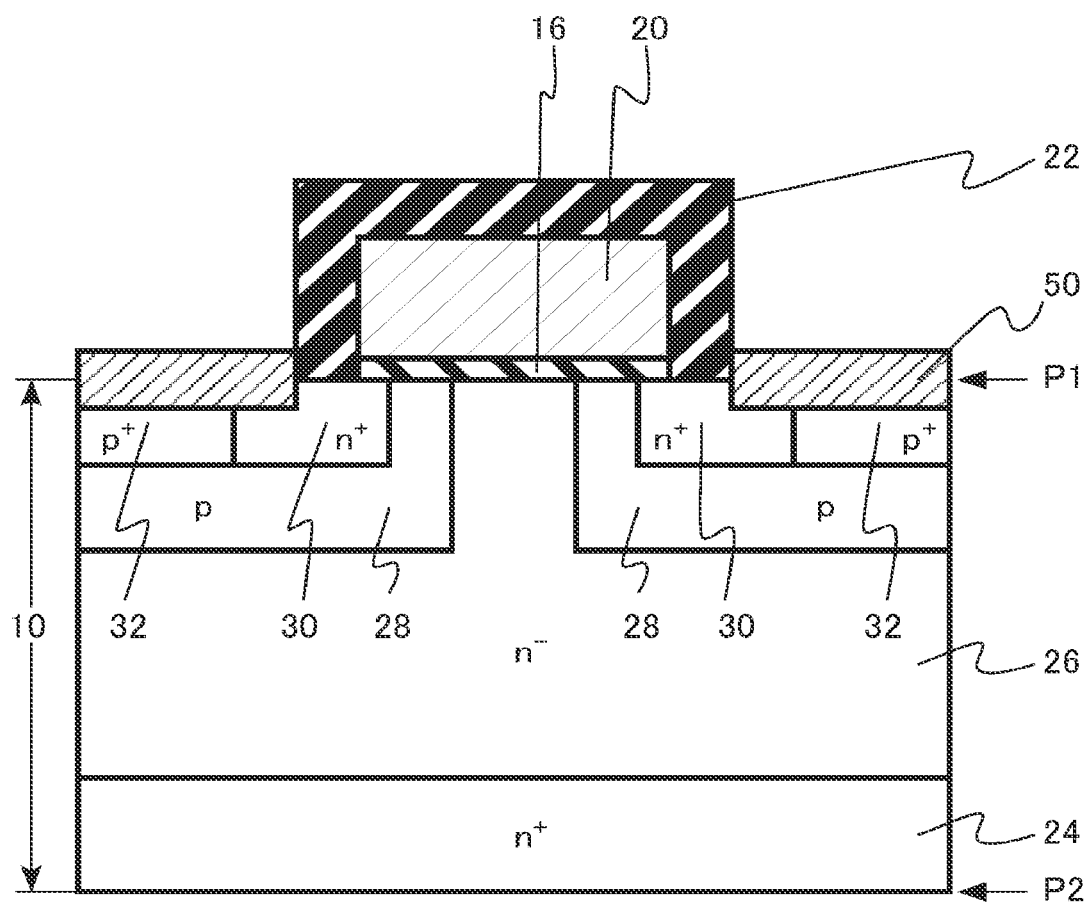
FIG. 14 is a schematic cross-sectional view illustrating the method for manufacturing the semiconductor device of the first embodiment.

In Step S124, the unreacted nickel film 48 is removed (FIG. 14). The unreacted nickel film is removed by, for example, wet etching.

Figure 15:
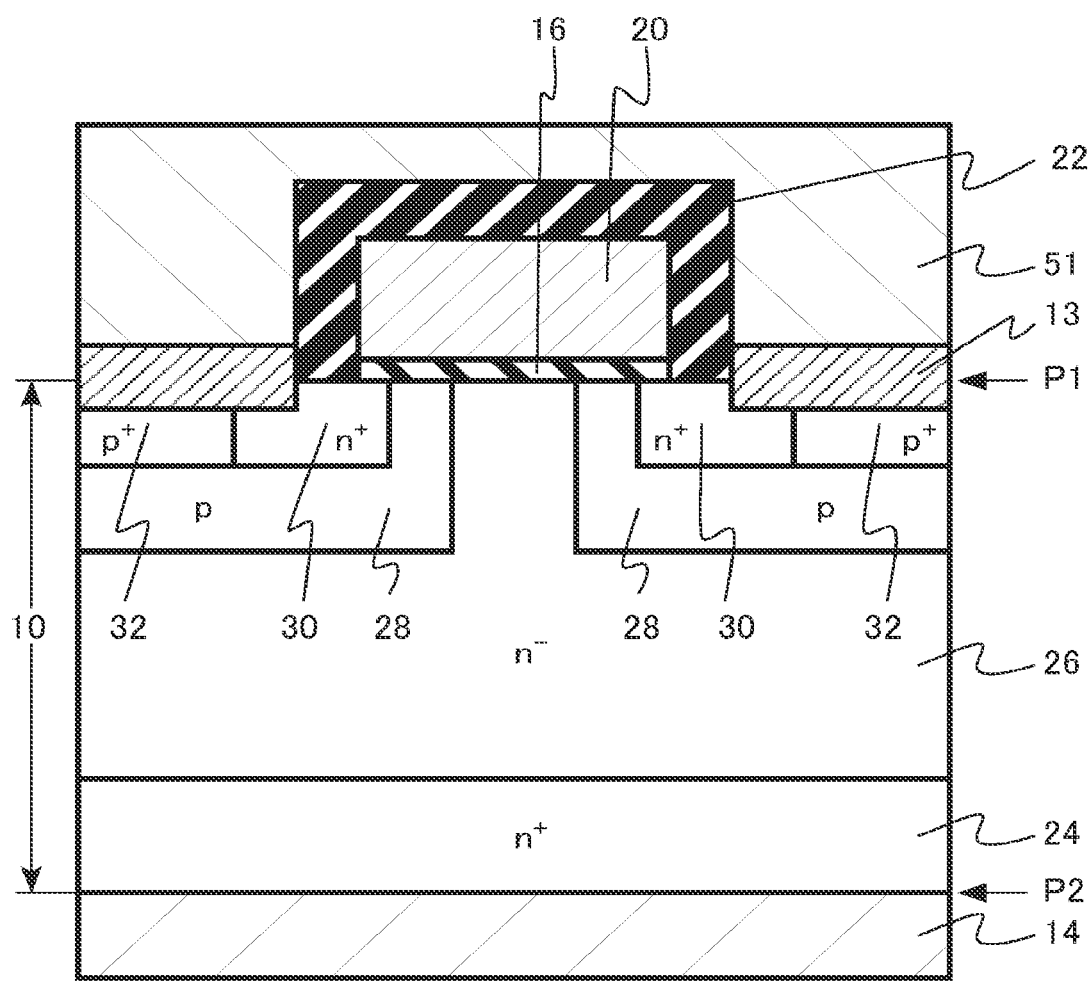
FIG. 15 is a schematic cross-sectional view illustrating the method for manufacturing the semiconductor device of the first embodiment.

Thereafter, an aluminum film 51 is formed on the nickel silicide layer 50 in Step S126 (FIG. 15). The aluminum film 51 is an example of the second metal film. The aluminum film 51 is formed by, for example, a sputtering method.

The aluminum film 51 is patterned and eventually serves as the source electrode 12.

In Step S128, the conductive drain electrode 14 is formed on a side of the silicon carbide layer 10 opposite to the source electrode 12. In other words, the drain electrode 14 is formed with the drift region 26 interposed between the drain electrode 14 and the source electrode 12. The drain electrode 14 is formed by, for example, sputtering of a nickel film.

The MOSFET 100 illustrated in FIG. 1 is formed according to the above manufacturing method.

Next, a function and an effect of the semiconductor device of the first embodiment and the method for manufacturing the semiconductor device will be described.

In the MOSFET 100 using the silicon carbide, it is desired to reduce the contact resistance between the n-type source region 30 and the source electrode 12 in order to reduce the on-resistance. Further, in order to implement the stable operation, it is desired to reduce the contact resistance between the p-type p-well contact region 32 and the source electrode 12. It is desired to simultaneously reduce both the contact resistance between the n-type source region 30 and the source electrode 12 and the contact resistance between the p-type p-well contact region 32 and the source electrode 12.

In the MOSFET 100, the metal silicide layer 13 is provided between the source region 30 and the source electrode 12, and between the p-well contact region 32 and the source electrode 12. Since the metal silicide layer 13 is used, the contact resistance between the source region 30 and the source electrode 12 and the contact resistance between the p-well contact region 32 and the source electrode 12 are reduced.

It is generally known that the contact resistance between an n-type silicon carbide region and a metal silicide layer decreases as a temperature of silicidation anneal increases. On the other hand, it is known that the contact resistance between a p-type silicon carbide region and a metal silicide layer increases as a temperature of silicidation anneal increases.

Therefore, it is difficult to simultaneously reduce both the contact resistance between the n-type source region 30 and the source electrode 12 and the contact resistance between the p-type p-well contact region 32 and the source electrode 12.

When the metal element (M) contained in the metal silicide layer is one selected from the group consisting of nickel (Ni), palladium (Pd), platinum (Pt), and chromium (Cr), the following facts have been found as a result of the first principle calculation performed by the inventor.

That is, it has been found that the metal element (M) is likely to enter the carbon site of the crystal structure of the silicon carbide at a high temperature of 900° C. or higher and is likely to enter at an interstitial position of the crystal structure of the silicon carbide at a low temperature of lower than 900° C. In addition, it has been found that the metal element (M) entering the carbon site functions as a donor, and the metal element (M) entering at an interstitial position functions as an acceptor.

FIGS. 16A, 16B, 17A, and 17B are views illustrating a function and an effect of the semiconductor device of the first embodiment. FIGS. 16A, 16B, 17A, and 17B are views illustrating bands of the silicon carbide.

Figure 16A:
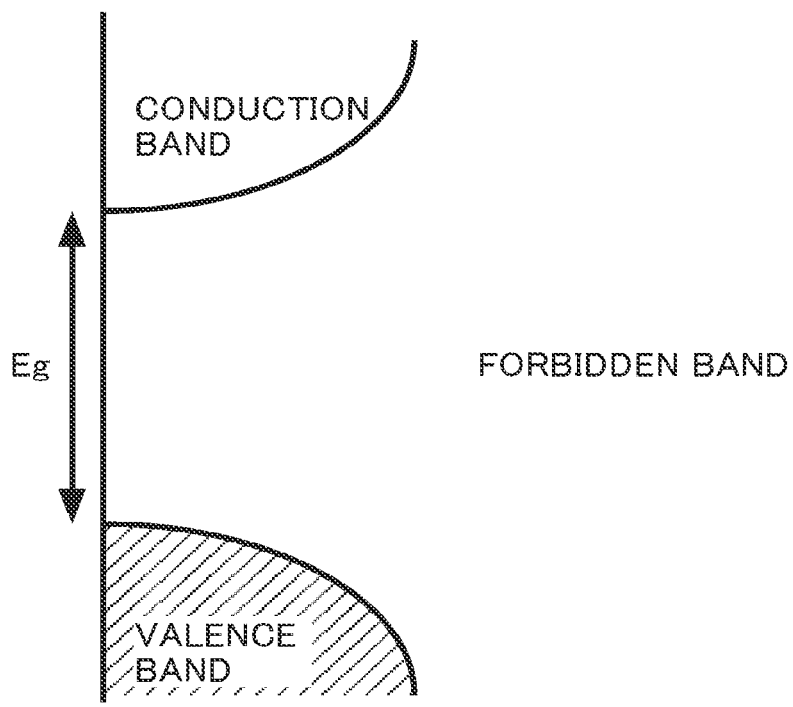
FIGS. 16A and 16B are views illustrating a function and an effect of the semiconductor device of the first embodiment.
Figure 16B:
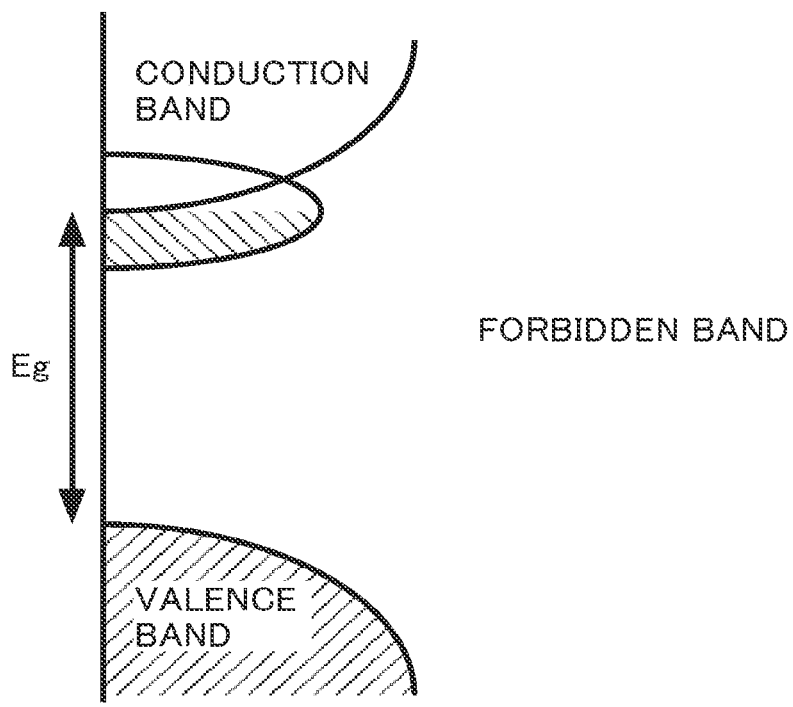

FIGS. 16A and 16B are explanatory views when the metal element (M) enters the carbon site of the crystal structure of the silicon carbide. FIG. 16A illustrates a case where the metal element (M) does not exist in the silicon carbide layer, and FIG. 16B illustrates a case where the metal element (M) exists in the silicon carbide layer.

When the metal element (M) enters the carbon site of the crystal structure of the silicon carbide as illustrated in FIG. 16B, a donor level is formed by the metal element (M) at a lower end of a conduction band, and an electron is supplied to the conduction band. The metal element (M) functions as a donor.

Figure 17A:
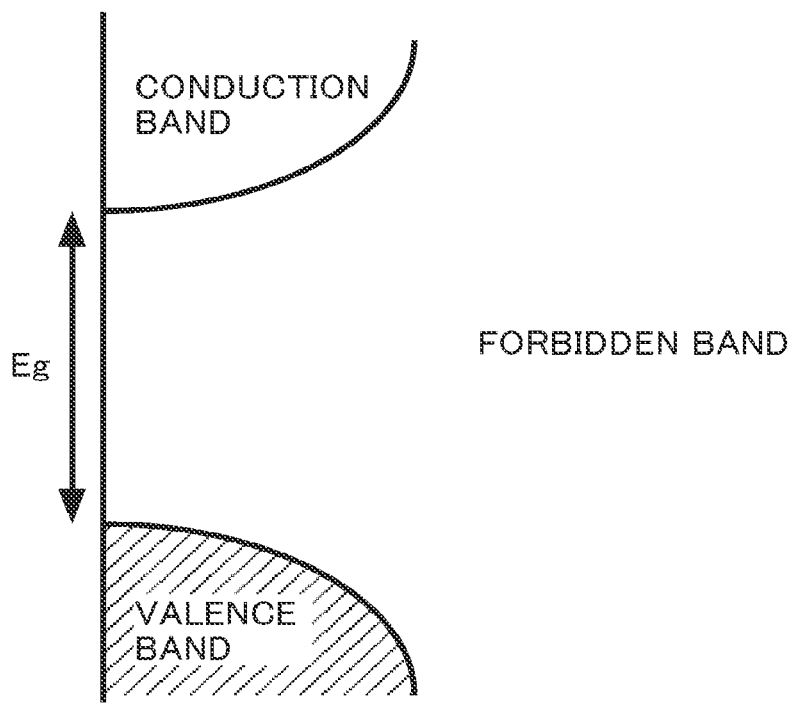
FIGS. 17A and 17B are views illustrating the function and the effect of the semiconductor device of the first embodiment.
Figure 17B:
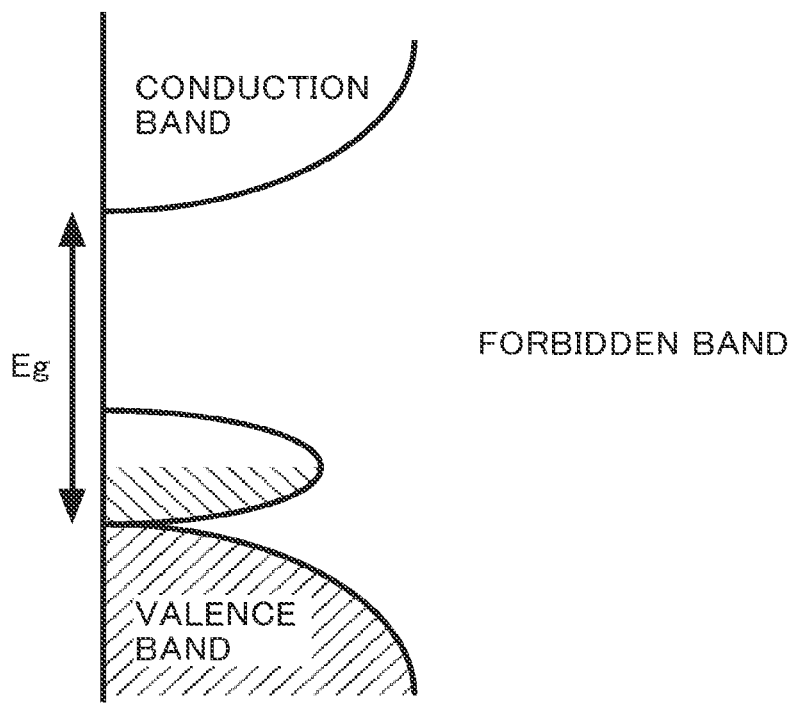

FIGS. 17A and 17B are explanatory views when the metal element (M) enters at an interstitial position of the crystal structure of the silicon carbide. FIG. 17A illustrates a case where the metal element (M) does not exist in the silicon carbide layer, and FIG. 17B illustrates a case where the metal element (M) exists in the silicon carbide layer.

When the metal element (M) enters at an interstitial position of the crystal structure of the silicon carbide as illustrated in FIG. 17B, an acceptor level is formed by the metal element (M) at an upper end of a valence band, an electron is supplied to the acceptor level, and a hole is formed in the valence band. The metal element (M) functions as an acceptor.

From the above calculation results, a reason why the contact resistance between the n-type silicon carbide region and the metal silicide layer decreases as the temperature of the silicidation anneal increases can be considered as follows. That is, the metal element having diffused from the metal film to the n-type silicon carbide region at the time of forming the metal silicide layer enters the carbon site of the crystal structure of the silicon carbide and serves as the donor when the temperature of the silicidation anneal is high. Therefore, a donor concentration in the n-type silicon carbide region becomes high. Therefore, a Schottky barrier between the n-type silicon carbide region and the metal silicide layer is lowered, a tunnel current is likely to flow, and the contact resistance decreases.

From the above calculation results, a reason why the contact resistance between the p-type silicon carbide region and the metal silicide layer increases as the temperature of the silicidation anneal increases can be considered as follows. That is, the metal element having diffused from the metal film to the p-type silicon carbide region at the time of forming the metal silicide layer enters the carbon site of the crystal structure of the silicon carbide and serves as the donor when the temperature of the silicidation anneal is high. Therefore, an acceptor concentration in the p-type silicon carbide region is canceled and lowered. Therefore, a Schottky barrier between the p-type silicon carbide region and the metal silicide layer rises, a tunnel current is less likely to flow, and the contact resistance increases.

In the MOSFET 100 of the first embodiment, among the metal elements (M) contained in the source region 30, the proportion of the metal element (M) positioned at the carbon site of the crystal structure of the silicon carbide is higher than the proportion of the metal element (M) positioned at an interstitial position of the crystal structure of the silicon carbide.

Therefore, the metal element (M) contained in the source region 30 mainly functions as a donor. Therefore, a donor concentration of the source region 30 becomes high, a Schottky barrier between the source region 30 and the metal silicide layer 13 is lowered, and a tunnel current is likely to flow. Then, the contact resistance between the source region 30 and the metal silicide layer 13 decreases. Accordingly, the contact resistance between the source region 30 and the source electrode 12 decreases.

In the MOSFET 100 of the first embodiment, among the metal elements (M) contained in the p-well contact region 32, the proportion of the metal element (M) positioned at an interstitial position of the crystal structure of the silicon carbide is higher than the proportion of the metal element (M) positioned at the carbon site of the crystal structure of the silicon carbide.

Therefore, the metal element (M) contained in the p-well contact region 32 mainly functions as an acceptor. Therefore, an acceptor concentration of the p-well contact region 32 becomes high, a Schottky barrier between the p-well contact region 32 and the metal silicide layer 13 is lowered, and a tunnel current is likely to flow. Then, the contact resistance between the p-well contact region 32 and the metal silicide layer 13 decreases. Accordingly, the contact resistance between the p-well contact region 32 and the source electrode 12 decreases.

From the viewpoint of reducing the contact resistance between the source region 30 and the source electrode 12, the concentration of the metal element (M) in the source region 30 is preferably $1\times10^{11}$ cm$^{-3}$ or more, more preferably $1\times10^{19}$ cm$^{-3}$ or more, and even more preferably $1\times10^{20}$ cm$^{-3}$ or more.

In addition, from the viewpoint of reducing the contact resistance between the p-well contact region 32 and the source electrode 12, the concentration of the metal element (M) in the p-well contact region 32 is preferably $1\times10^{18}$ cm$^{-3}$ or more, more preferably $1\times10^{19}$ cm$^{-3}$ or more, and even more preferably $1\times10^{20}$ cm$^{-3}$ or more.

In the method for manufacturing the MOSFET 100 of the first embodiment, the first treatment to increase the carbon vacancies in the first region where the source region 30 is formed is performed. Since the first treatment to increase the carbon vacancies in the first region is performed, the metal element (M) in the source region 30 is likely to enter the carbon site of the crystal structure of the silicon carbide. Even if the silicidation anneal is performed at a temperature lower than 900° C., the metal element (M) is likely to enter the carbon site of the crystal structure of the silicon carbide. Accordingly, the donor concentration of the source electrode 12 becomes high.

The first treatment to increase the carbon vacancies in the first region is, for example, ion implantation of argon (Ar) into the first region. For example, the same second mask material 42 as that used for the ion implantation of the n-type impurity to form the source region 30 is used for the ion implantation of argon (Ar). In this case, the ion implantation of argon (Ar) is performed before the activation anneal. Note that it is also possible to perform the ion implantation of argon (Ar) into the first region after the activation anneal.

In addition, the second treatment to decrease the carbon vacancies in the second region where the p-well contact region 32 is formed is performed in the method for manufacturing the MOSFET 100 of the first embodiment. Since the second treatment to decrease the carbon vacancies in the second region is performed, the metal element (M) in the p-well contact region 32 is likely to enter at an interstitial position of the crystal structure of the silicon carbide. When the silicidation anneal is performed at a temperature lower than 900° C., the metal element (M) is more likely to enter at an interstitial position of the crystal structure of the silicon carbide. Accordingly, the acceptor concentration of the p-well contact region 32 becomes high.

The second treatment to decrease the carbon vacancies in the second region is, for example, ion implantation of carbon (C) into the second region. For example, the same third mask material 44 as that used for the ion implantation of the p-type impurity to form the p-well contact region 32 is used for the ion implantation of carbon (C). In this case, the ion implantation of carbon (C) is performed before the activation anneal. Note that it is also possible to perform the ion implantation of carbon (C) into the second region after the activation anneal.

From the viewpoint of increasing the donor concentration of the source region 30, the silicidation anneal temperature is preferably 500° C. or higher, more preferably 600° C. or higher, even more preferably 700° C. or higher, and most preferably 800° C. or higher. In the method for manufacturing the MOSFET 100 of the first embodiment, a large number of carbon vacancies are generated in advance, and the metal element (M) is diffused. Originally, it is more stable for the metal element to remain at an interstitial position in the case of anneal at a temperature lower than 900° C., but the metal element preferentially enters the carbon vacancies and is stabilized if there is the carbon vacancies. That is, if anneal is performed for a long time at an anneal temperature of lower than 900° C., the metal element can be introduced into the carbon vacancies created in advance. Since the introduced amount corresponds to the amount of the carbon vacancies created in advance, it is important to create the necessary amount of carbon vacancies and to allow sufficient time for diffusing metal commensurate with the carbon vacancies. Even with the anneal at a temperature lower than 900° C., it is possible to introduce a larger amount of metal into the carbon position as compared with conventional anneal at a temperature higher than 900° C. The introduced amount of carbon vacancies is preferably $1\times10^{18}$ cm$^{-3}$ or more, and more preferably $1\times10^{19}$ cm$^{-3}$ or more. From the viewpoint of suppressing the amount of crystal defects, the introduced amount is preferably $1\times10^{22}$ cm$^{-3}$ or less, and more preferably $1\times10^{21}$ cm$^{-3}$ or less.

From the viewpoint of increasing the acceptor concentration of the p-well contact region 32, the silicidation anneal temperature is preferably lower than 900° C. Since the second treatment to decrease the carbon vacancies is performed, the amount of carbon vacancies is set to be less than $1\times10^{12}$ cm$^{-3}$, and further about $1\times10^{11}$ cm. If the silicidation anneal temperature is lower than 900° C., the metal enters the carbon position so that it is unnecessary to consider the increase of the donor. However, if the silicidation anneal temperature exceeds 900° C., the metal starts to enter the carbon position, and thus, the acceptor concentration is lowered even if the second treatment to decrease the carbon vacancies is performed. On the other hand, the amount of diffusion between the lattices increases as the silicidation anneal temperature increases, and thus, a treatment at a temperature as high as possible while being lower than 900° C. is desirable. Accordingly, the silicidation anneal temperature is preferably at least 500° C. or higher, more preferably 550° C. or higher, and even more preferably 600° C. or higher.

According to the MOSFET 100 of the first embodiment and the method for manufacturing the same, both the contact resistance between the source region 30 and the source electrode 12 and the contact resistance between the p-well contact region 32 and the source electrode 12 are simultaneously reduced. Therefore, the on-resistance of the MOSFET 100 is reduced, and the stable operation is implemented.

As described above, the semiconductor device capable of reducing the contact resistance between the silicon carbide layer and the metal electrode can be implemented according to the first embodiment.

Second Embodiment

A method for manufacturing a semiconductor device of a second embodiment differs from the manufacturing method of the first embodiment in that the first treatment to increase carbon vacancies is a treatment to irradiate a first region with an electron beam, and the second treatment to decrease carbon vacancies is a treatment to expose a second region to an atmosphere containing a methane gas. Hereinafter, some of the content overlapping with that in the first embodiment will not be described.

The method for manufacturing the semiconductor device of the second embodiment is an example of the method for manufacturing the vertical MOSFET 100 illustrated in FIG. 1.

Figure 18:
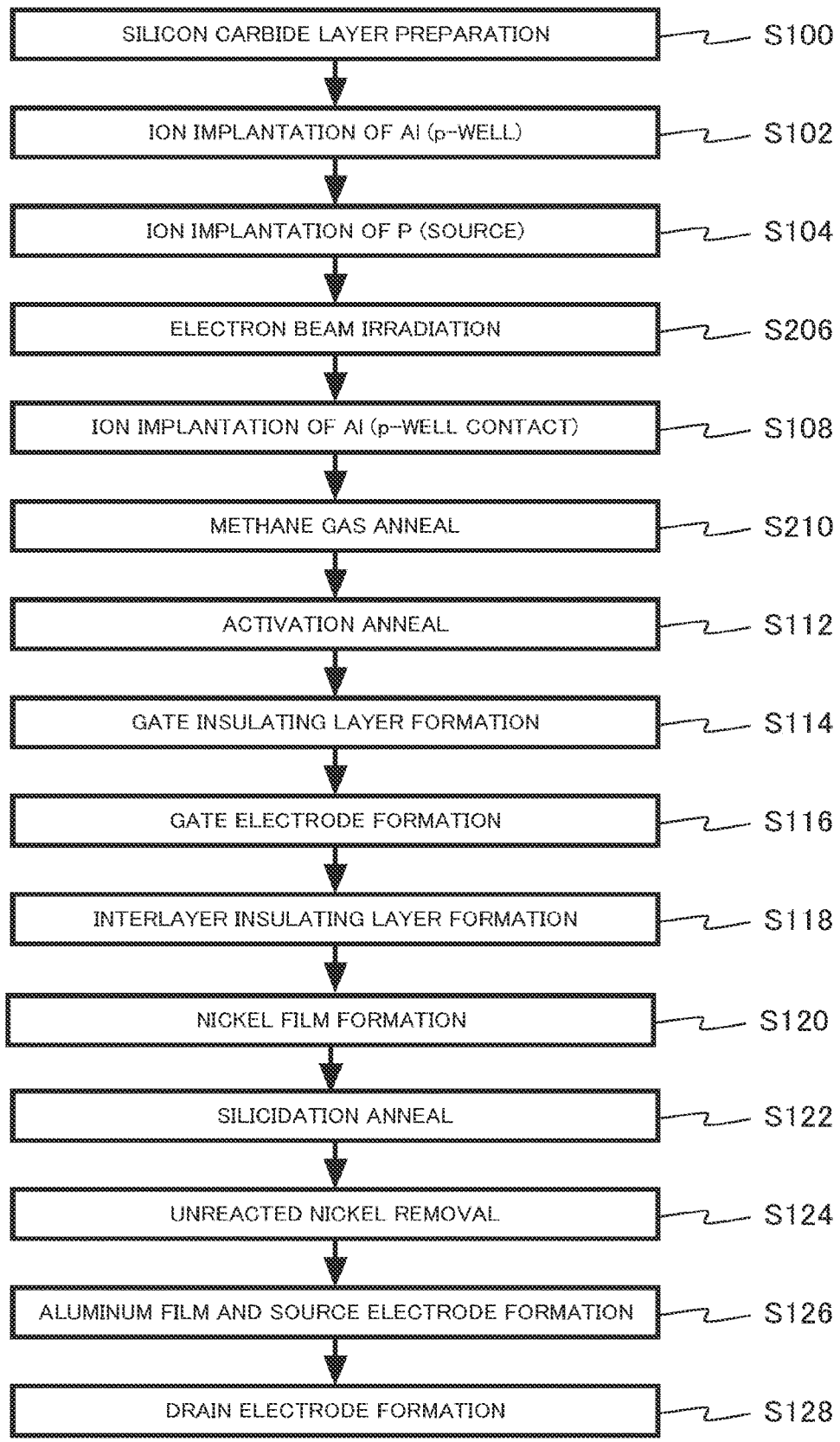
FIG. 18 is a flowchart of a process exemplifying a method for manufacturing a semiconductor device of a second embodiment.

FIG. 18 is a flowchart of a process exemplifying the method for manufacturing the semiconductor device of the second embodiment.

As illustrated in FIG. 18, the method for manufacturing the semiconductor device includes: silicon carbide layer preparation (Step S100); ion implantation of Al (Step S102); ion implantation of P (Step S104); electron beam irradiation (Step S206); ion implantation of Al (Step S108); methane gas anneal (Step S210); activation anneal (Step S112); gate insulating layer formation (Step S114); gate electrode formation (Step S116); interlayer insulating layer formation (Step S118); nickel film formation (Step S120); silicidation anneal (Step S122); unreacted nickel film removal (Step S124); aluminum film and source electrode formation (Step S126); and drain electrode formation (Step S128).

Except for the electron beam irradiation (Step S206) and the methane gas anneal (Step 3210), the method for manufacturing the semiconductor device of the second embodiment is the same as the method for manufacturing the semiconductor device of the first embodiment.

In Step S206, the source region 30 is irradiated with an electron beam using the second mask material 42 as a mask. The irradiation of the source region 30 with the electron beam is an example of the first treatment to increase the carbon vacancies in the first region. The electron beam irradiation breaks the bonding of the silicon carbide in the source region 30 and increases the carbon vacancies in the source region 30.

Step S210 is anneal in an atmosphere containing a methane gas ($CH_4$). The methane gas anneal exposes the p-well contact region 32 to the atmosphere containing the methane gas ($CH_4$). The methane gas anneal is an example of the second treatment to decrease the carbon vacancies in the second region. With the methane gas anneal, the carbon vacancies in the p-well contact region 32 are filled with carbon, and the carbon vacancies decrease.

As described above, according to the second embodiment, the semiconductor device capable of reducing the contact resistance between the silicon carbide layer and the metal electrode can be implemented as in the first embodiment.

Third Embodiment

A semiconductor device of a third embodiment differs from the semiconductor device of the first embodiment in that a carbon concentration of a conductive layer is $1\times10^{17}$ $cm^{-3}$ or less. In addition, a method for manufacturing the semiconductor device of the third embodiment is different in that a second heat treatment is performed in an atmosphere containing at least any one of carbon dioxide and atomic hydrogen. Hereinafter, some of the content overlapping with that in the first embodiment will not be described.

The semiconductor device of the third embodiment is a vertical MOSFET. The MOSFET of the third embodiment is an n-channel transistor that uses electrons as carriers. The semiconductor device of the third embodiment has a structure similar to the structure illustrated in FIG. 1.

The metal silicide layer 13 contains, for example, a silicide of one metal element (M) selected from the group consisting of nickel (Ni), palladium (Pd), platinum (Pt), and chromium (Cr). The metal silicide layer 13 contains a nickel silicide, a palladium silicide, a platinum silicide, or a chromium silicide. The metal silicide layer 13 is, for example, a nickel silicide, a palladium silicide, a platinum silicide, or a chromium silicide.

The carbon concentration of the metal silicide layer 13 is $1\times10^{17}$ $cm^{-3}$ or less.

An atomic ratio (M/Si) of the metal element (M) to silicon (Si) in the metal silicide layer 13 is 1.2 or more, for example. For example, it is assumed that the metal silicide layer 13 is a nickel silicide. Nickel has a plurality of silicide phases represented by composition formulas of $Ni_{31}Si_{12}$, $Ni_2Si$, $NiSi$, and $NiSi_2$. Atomic ratios (Ni/Si) of nickel to silicon (Si) of $Ni_{31}Si_{12}$, $Ni_2Si$, $NiSi$, and $NiSi_2$ are 2.6, 2.0, 1.0, and 0.5, respectively.

Figure 19:
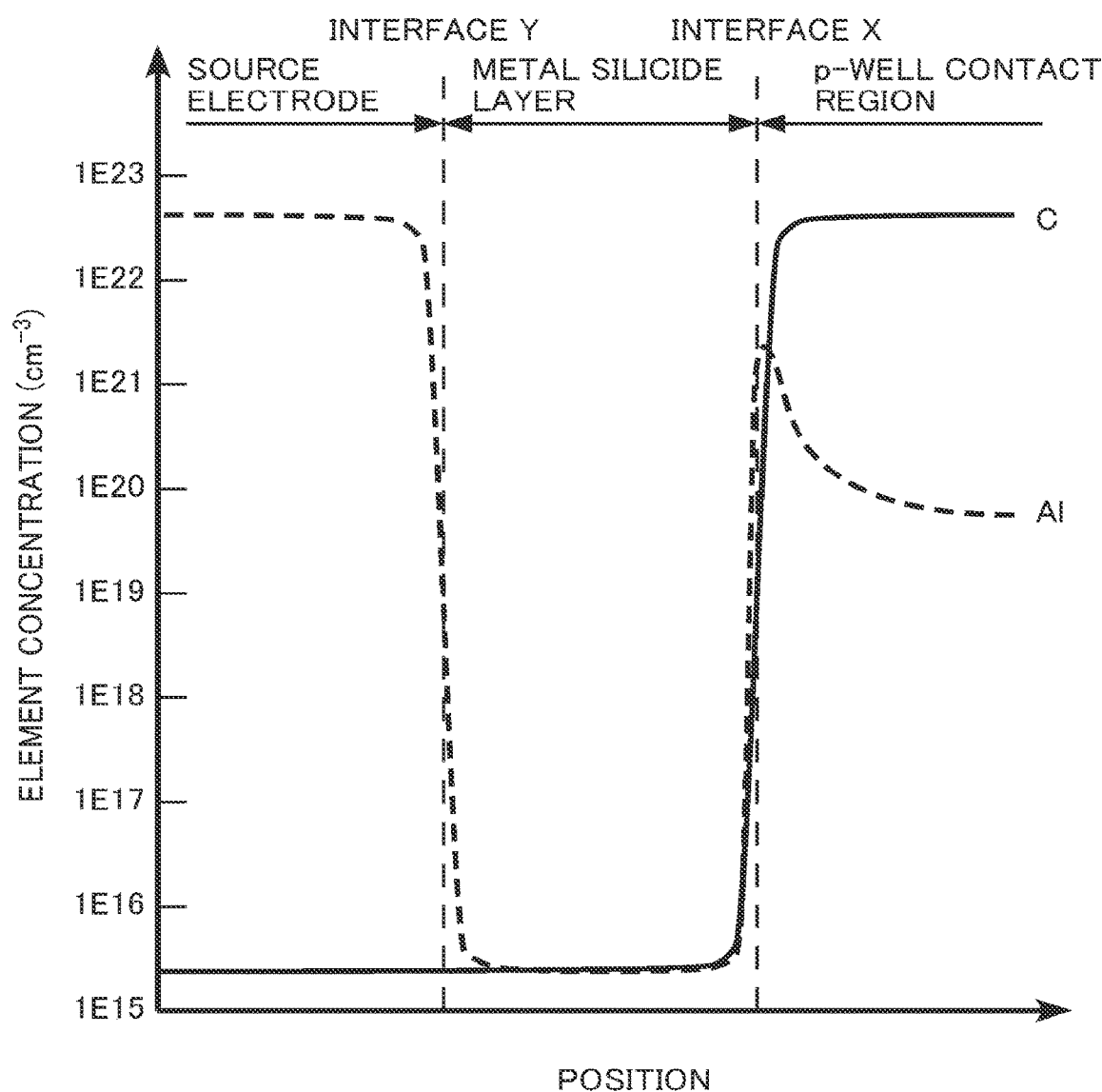
FIG. 19 is a graph illustrating element concentration distributions of a semiconductor device of a third embodiment.

FIG. 19 is a graph illustrating element concentration distributions of the semiconductor device of the third embodiment. FIG. 19 is a graph illustrating element concentration distributions in the source electrode 12, the metal silicide layer 13, and the p-well contact region 32. FIG. 19 is a graph illustrating the element distribution in a direction normal to the first plane P1. FIG. 19 illustrates a case where the p-type impurity contained in the p-well contact region 32 is aluminum (Al) and the source electrode 12 contains aluminum.

The carbon concentration of the metal silicide layer 13 is $1\times10^{17}$ $cm^{-3}$ or less. The carbon concentration of the metal silicide layer 13 is $1\times10^{15}$ $cm^{-3}$ or less.

For example, the carbon concentration of the metal silicide layer 13 is represented by a carbon concentration of a region separated by a predetermined distance or more from an interface (interface X in FIG. 19) between the p-well contact region 32 and the metal silicide layer 13 and an interface (interface Y in FIG. 19) between the source electrode 12 and the metal silicide layer 13. The predetermined distance is, for example, 10 nm. The carbon concentration of the metal silicide layer 13 is represented by, for example, a carbon concentration of a central portion of the metal silicide layer 13.

The carbon concentration of the source electrode 12 is $1\times10^{17}$ $cm^{-3}$ or less. The carbon concentration of the source electrode 12 is $1\times10^{16}$ $cm^{-3}$ or less.

The carbon concentration of the source electrode 12 is represented by, for example, a carbon concentration of a region separated by a predetermined distance or more from the interface (interface Y in FIG. 19) between the source electrode 12 and the metal silicide layer 13. The predetermined distance is, for example, 10 nm.

The concentration distribution of aluminum in the p-well contact region 32 and the metal silicide layer 13 has a peak at the interface (interface X in FIG. 19) between the p-well contact region 32 and the metal silicide layer 13. An aluminum concentration at the peak of the aluminum concentration distribution is, for example, $1\times10^{20}$ $cm^{-3}$ or more and $1\times10^{22}$ $cm^{-3}$ or less.

The aluminum concentration of the metal silicide layer 13 is $1\times10^{17}$ $cm^{-3}$ or less. The aluminum concentration of the metal silicide layer 13 is $1\times10^{16}$ $cm^{-3}$ or less.

For example, the aluminum concentration of the metal silicide layer 13 is represented by an aluminum concentration of a region separated by a predetermined distance or more from the interface (interface X in FIG. 19) between the p-well contact region 32 and the metal silicide layer 13 and the interface (interface Y in FIG. 19) between the source electrode 12 and the metal silicide layer 13. The predetermined distance is, for example, 10 nm. The aluminum concentration of the metal silicide layer 13 is represented by, for example, an aluminum concentration of a central portion of the metal silicide layer 13.

Figure 20:
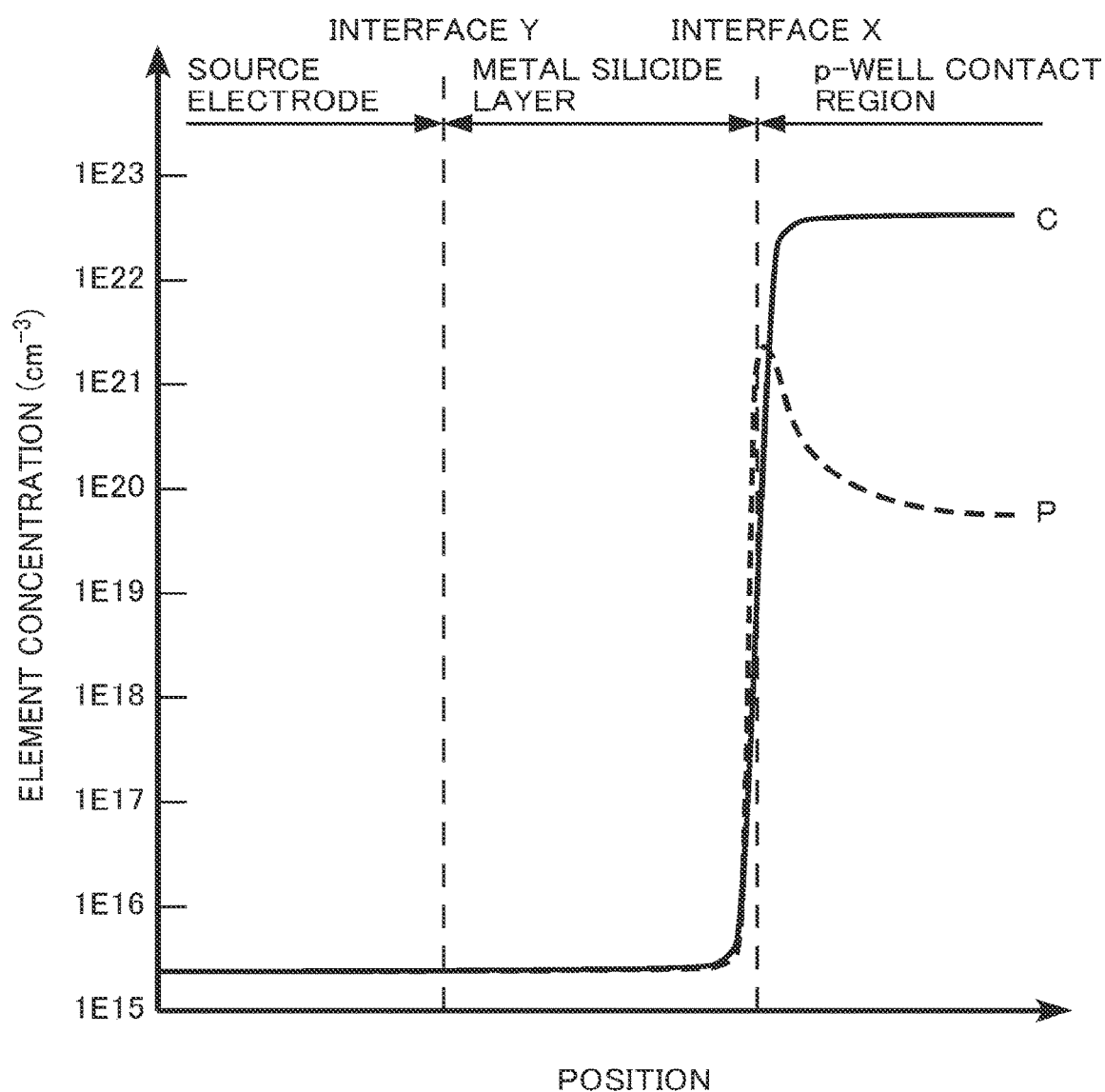
FIG. 20 is a graph illustrating element concentration distributions of the semiconductor device of the third embodiment.

FIG. 20 is a graph illustrating element concentration distributions of the semiconductor device of the third embodiment. FIG. 20 is a graph illustrating the element concentration distributions in the source electrode 12, the metal silicide layer 13, and the source region 30. FIG. 20 is a graph illustrating the element distribution in a direction normal to a front surface of the first plane P1. FIG. 20 illustrates a case where the n-type impurity contained in the source region 30 is phosphorus (P).

The carbon concentration of the metal silicide layer 13 is $1 \times 10^{17}$ cm$^{-3}$ or less. The carbon concentration of the metal silicide layer 13 is $1 \times 10^{16}$ cm$^{-3}$ or less.

For example, the carbon concentration of the metal silicide layer 13 is represented by a carbon concentration of a region separated by a predetermined distance or more from an interface (interface X in FIG. 20) between the source region 30 and the metal silicide layer 13 and an interface (interface Y in FIG. 20) between the source electrode 12 and the metal silicide layer 13. The predetermined distance is, for example, 10 nm. The carbon concentration of the metal silicide layer 13 is represented by, for example, a carbon concentration of a central portion of the metal silicide layer 13.

The carbon concentration of the source electrode 12 is $1 \times 10^{17}$ cm$^{-3}$ or less. The carbon concentration of the source electrode 12 is $1 \times 10^{16}$ cm$^{-3}$ or less.

The carbon concentration of the source electrode 12 is represented by, for example, a carbon concentration of a region separated by a predetermined distance or more from the interface (interface Y in FIG. 20) between the source electrode 12 and the metal silicide layer 13. The predetermined distance is, for example, 10 nm.

A concentration distribution of phosphorus in the source region 30 and the metal silicide layer 13 has a peak at the interface (interface X in FIG. 20) between the source region 30 and the metal silicide layer 13. A phosphorus concentration at the peak of the phosphorus concentration distribution is, for example, $1 \times 10^{20}$ cm$^{-3}$ or more and $1 \times 10^{22}$ cm$^{-3}$ or less.

The phosphorus concentration of the metal silicide layer 13 is $1 \times 10^{17}$ cm$^{-3}$ or less. The phosphorus concentration of the metal silicide layer 13 is $1 \times 10^{16}$ cm$^{-3}$ or less.

For example, the phosphorus concentration of the metal silicide layer 13 is represented by a phosphorus concentration of a region separated by a predetermined distance or more from an interface (interface X in FIG. 20) between the source region 30 and the metal silicide layer 13 and an interface (interface Y in FIG. 20) between the source electrode 12 and the metal silicide layer 13. The predetermined distance is, for example, 10 nm. The phosphorus concentration of the metal silicide layer 13 is represented by, for example, a phosphorus concentration of a central portion of the metal silicide layer 13.

In the method for manufacturing the semiconductor device of the third embodiment, silicidation anneal is performed in an atmosphere containing at least any one of carbon dioxide and atomic hydrogen. A temperature of the silicidation anneal is, for example, 500° C. or higher and lower than 900° C. The silicidation anneal is an example of the second heat treatment.

The method for manufacturing the semiconductor device of the third embodiment is the same as the method for manufacturing the semiconductor device of the first embodiment, except for conditions for the silicidation anneal.

Hereinafter, a function and an effect of the semiconductor device of the third embodiment and the method for manufacturing the semiconductor device will be described.

In the MOSFET of the third embodiment, the carbon concentration in the metal silicide layer 13 is $1 \times 10^{17}$ cm$^{-3}$ or less. With this configuration, the contact resistance between the silicon carbide layer 10 and the source electrode 12 decreases. Details will be described hereinafter.

A case where silicidation anneal is performed in an atmosphere containing nitrogen as in the first embodiment, for example, is considered.

When the silicidation anneal is performed in the atmosphere containing nitrogen, excess carbon in the silicon carbide layer 10 is precipitated as a carbon cluster. The carbon cluster is precipitated at an interface between the silicon carbide layer 10 and the metal silicide layer 13, in the metal silicide layer 13, or at an interface between the metal silicide layer 13 and the source electrode 12.

A large amount of the carbon cluster increases the contact resistance between the silicon carbide layer 10 and the source electrode 12. Further, there is a possibility that the large amount of the carbon cluster causes separation between the silicon carbide layer 10 and the metal silicide layer 13, or between the metal silicide layer 13 and the source electrode 12.

Figure 21:
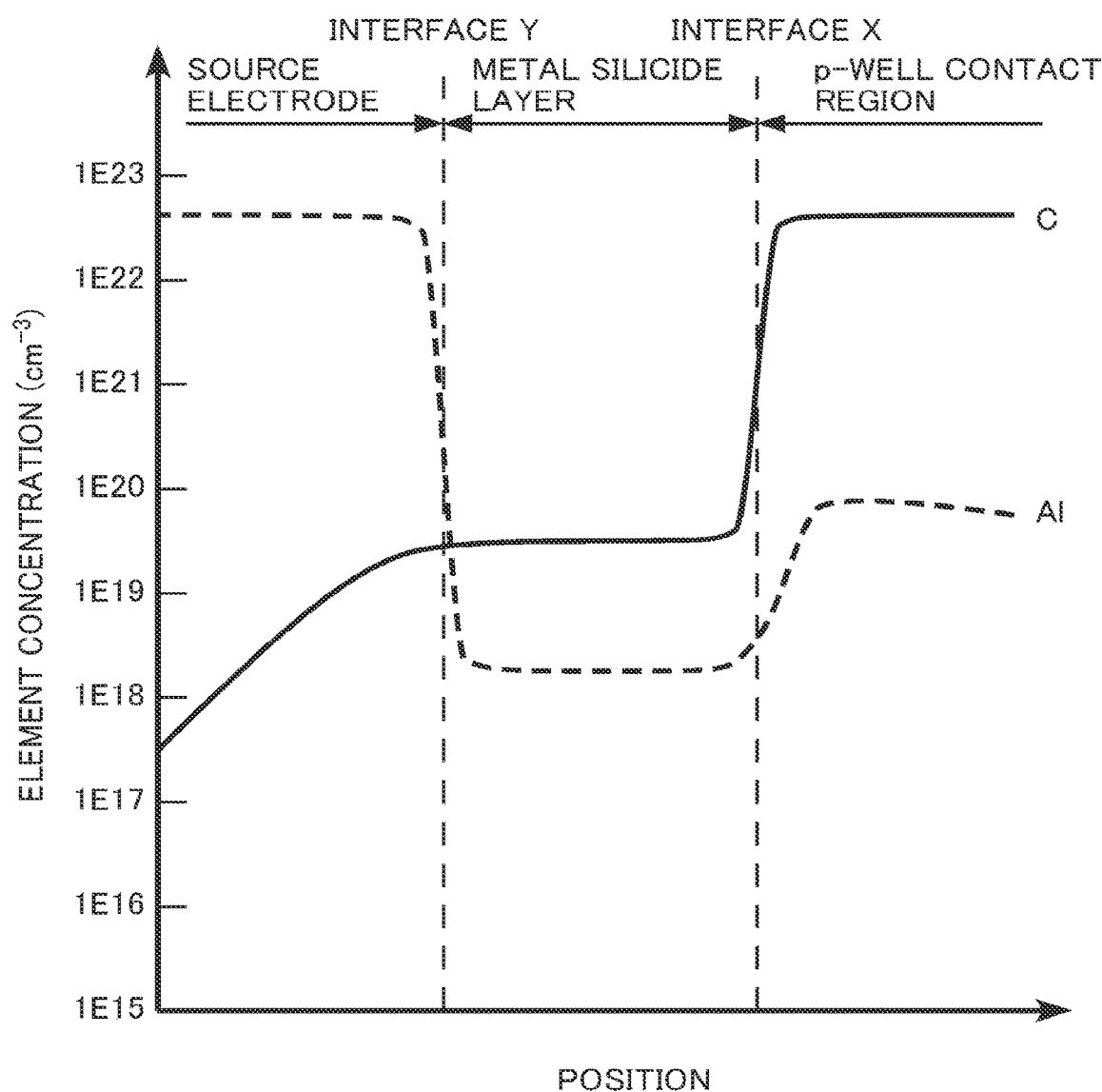
FIG. 21 is a graph illustrating element concentration distributions of the semiconductor device of the first embodiment.

FIG. 21 is a graph illustrating element concentration distributions of the semiconductor device of the first embodiment. The semiconductor device of the first embodiment is the same as the semiconductor device of the third embodiment, except for being manufactured by performing the silicidation anneal in the atmosphere containing nitrogen.

FIG. 21 is a graph illustrating element concentration distributions in the source electrode 12, the metal silicide layer 13, and the p-well contact region 32.

The carbon concentration of the metal silicide layer 13 may be $1 \times 10^{18}$ cm$^{-3}$ or more. The carbon concentration of the metal silicide layer 13 may be $1 \times 10^{19}$ cm$^{-3}$ or more.

The carbon concentration of the source electrode 12 may be $1 \times 10^{17}$ cm$^{-3}$ or more. The carbon concentration of the source electrode 12 may be $1 \times 10^{18}$ cm$^{-3}$ or more.

It is considered that the carbon concentration of the source electrode 12 increases as carbons in the metal silicide layer 13 diffuse into the source electrode 12.

The concentration distribution of aluminum in the p-well contact region 32 and the metal silicide layer 13 decreases from the p-well contact region 32 toward the interface (interface X in FIG. 21) between the p-well contact region 32 and the metal silicide layer 13. The aluminum concentration at the interface X is, for example, $1 \times 10^{19}$ cm$^{-3}$ or less.

The aluminum concentration of the metal silicide layer 13 is $1 \times 10^{17}$ cm$^{-3}$ or more. The aluminum concentration of the metal silicide layer 13 is $1 \times 10^{18}$ cm$^{-3}$ or more.

When the heat treatment for forming the metal silicide layer 13 is performed in an atmosphere containing nitrogen, excessive carbons bond with aluminum to stably form a carbon-aluminum composite (Al—C pair) in the metal silicide layer 13. Therefore, it is considered that aluminum in the p-well contact region 32 is sucked out to the metal silicide layer 13 and the aluminum concentration in the metal silicide layer 13 increases. Further, it is considered that the aluminum concentration in the p-well contact region 32 decreases as aluminum is sucked out to the metal silicide layer 13.

The MOSFET of the third embodiment has a smaller amount of the carbon cluster existing at the interface between the p-well contact region 32 and the metal silicide layer 13, in the metal silicide layer 13, or at the interface between the metal silicide layer 13 and the source electrode 12 than the MOSFET 100 of the first embodiment. In the MOSFET of the third embodiment, for example, the carbon cluster does not exist. Since the amount of the carbon cluster is small, the carbon concentration in the metal silicide layer 13 is lower than that in the MOSFET 100 of the first embodiment. The carbon concentration in the metal silicide layer 13 of the MOSFET of the third embodiment is, for example, $1 \times 10^{17}$ cm$^{-3}$ or less.

Since the amount of the carbon cluster is small in the MOSFET of the third embodiment, the contact resistance between the p-well contact region 32 and the source electrode 12 decreases. Since the amount of carbon clusters is small in the MOSFET of the third embodiment, the possibility of separation between the p-well contact region 32 and the metal silicide layer 13 or between the metal silicide layer 13 and the source electrode 12 is reduced.

The MOSFET of the third embodiment can be implemented by performing the heat treatment for forming the metal silicide layer 13 in an atmosphere containing at least any one of carbon dioxide and atomic hydrogen. Since the heat treatment is performed in the atmosphere containing at least any one of carbon dioxide and atomic hydrogen, the amount of the carbon cluster in the MOSFET of the third embodiment can be reduced.

First, a case where the heat treatment for forming the metal silicide layer 13 is performed in an atmosphere containing carbon dioxide is considered. As a result of first principle calculation performed by the inventor, it has been found that the following Formula (1) is established.

$$C + CO_2 = 2CO + 2.84 \text{ eV} \qquad \text{Formula (1)}$$

From Formula (1), when excess carbon (C) and carbon dioxide ($CO_2$) coexist during the heat treatment for forming the metal silicide layer 13, it can be understood that it is more stable that the reaction occurs to form carbon monoxide (CO). Therefore, since the heat treatment for forming the metal silicide layer 13 is performed in the atmosphere containing carbon dioxide, excess carbon becomes carbon monoxide and diffuses outward, and does not form the carbon cluster. Accordingly, the amount of the carbon cluster in the MOSFET of the third embodiment is reduced.

Next, a case where the heat treatment for forming the metal silicide layer 13 is performed in an atmosphere containing atomic hydrogen is considered. As a result of first principle calculation performed by the inventor, it has been found that the following Formula (2) is established.

$$C + 4H = CH_4 + 14.52 \text{ eV} \qquad \text{Formula (2)}$$

From Formula (2), when excess carbon (C) and atomic hydrogen (H) coexist during the heat treatment for forming the metal silicide layer 13, it can be understood that it is more stable that the reaction occurs to form methane ($CH_4$). Therefore, since the heat treatment for forming the metal silicide layer 13 is performed in the atmosphere containing atomic hydrogen, excess carbon becomes methane and diffuses outward, and does not form the carbon cluster. Accordingly, the amount of the carbon cluster in the MOSFET of the third embodiment is reduced.

As a result of first principle calculation performed by the inventor, it has been found that the following Formula (3) is established.

$$2C + 2H_2 = CH_4 - 4.48 \text{ eV} \qquad \text{Formula (3)}$$

From Formula (3), when the heat treatment for forming the metal silicide layer 13 is performed in the atmosphere containing a hydrogen gas, that is, molecular hydrogen (H), it can be understood that coexistence of excess carbon (C) and molecular hydrogen ($H_2$) is more stable than formation of methane ($CH_4$). Therefore, the excess carbon remains, and the carbon cluster is formed.

When the heat treatment for forming the metal silicide layer 13 is performed in the atmosphere containing nitrogen, the reaction between excess carbon (C) and nitrogen does not occur. Therefore, the excess carbon remains, and the carbon cluster is formed.

In the MOSFET of the third embodiment, the carbon concentration of the metal silicide layer 13 is preferably $1 \times 10^{17}$ cm$^{-3}$ or less, and more preferably $1 \times 10^{16}$ cm$^{-3}$ or less. When the carbon concentration satisfies the above range, the amount of the carbon cluster is further reduced and the contact resistance decreases.

In the MOSFET of the third embodiment, the carbon concentration of the source electrode 12 is lower than that in the MOSFET 100 of the first embodiment. If the carbon concentration of the source electrode 12 is high, there is a possibility that the resistivity of the source electrode 12 increases or the reliability decreases, which is not preferable. The MOSFET of the third embodiment suppresses the increase in resistivity of the source electrode 12 and the decrease in reliability as compared with the MOSFET 100 of the first embodiment.

In the MOSFET of the third embodiment, the atomic ratio of the metal element (M) to silicon (Si) in the metal silicide layer 13 (M/Si) is preferably 1.2 or more, more preferably 1.5 or more, and even more preferably 1.8 or more. The higher the atomic ratio (M/Si) is, the lower the resistivity of the metal silicide is. Therefore, when the atomic ratio (M/Si) satisfies the above range, the resistivity of the metal silicide is lowered, and the contact resistance decreases.

The atomic ratio (M/Si) decreases as the temperature of the heat treatment for forming the metal silicide layer 13 increases. Therefore, the temperature of the heat treatment for forming the metal silicide layer 13 is preferably lower than 900° C., more preferably 850° C. or lower, even more preferably 800° C. or lower, and most preferably 750° C. or lower. Therefore, when the temperature of the heat treatment satisfies the above range, the resistivity of the metal silicide is lowered, and the contact resistance decreases.

In addition, when the temperature of the heat treatment for forming the metal silicide layer 13 is set to a low temperature, the outward diffusion of excess carbon is likely to proceed. From this viewpoint, the temperature of the heat treatment for forming the metal silicide layer 13 is preferably lower than 900° C., more preferably 850° C. or lower, even more preferably 800° C. or lower, and most preferably 750° C. or lower.

Meanwhile, from the viewpoint of sufficiently performing the silicide reaction, the temperature of the heat treatment for forming the metal silicide layer 13 is preferably 500° C. or higher, more preferably 550° C. or higher, and even more preferably 600° C. or higher.

For example, a case where the metal element is nickel (Ni) and the metal silicide layer 13 is a nickel silicide is considered. Nickel has silicide phases of $Ni_{31}Si_{12}$, $Ni_2Si$, NiSi, and $NiSi_1$. Atomic ratios of nickel to silicon (Si) (Ni/Si) in the respective silicide phases are 2.6, 2.0, 1.0, and 0.5.

The resistivity of each silicide layer satisfies the following inequality.

$$Ni_{31}Si_{12} < Ni_2Si < NiSi < NiSi_2$$

It is preferable that the proportion of $Ni_2Si$ contained in the metal silicide layer 13 be higher than that of NiSi contained in the metal silicide layer 13 from the viewpoint of reducing the contact resistance. In addition, it is preferable that the proportion of $Ni_2Si$ be the highest in the nickel silicide contained in the metal silicide layer 13.

A stable temperature range for $Ni_{31}Si_{12}$ is lower than 550° C., a stable temperature range for $Ni_2Si$ is 550° C. or higher and 800° C. or lower, a stable temperature range for NiSi is 800° C. or higher and 1000° C. or lower, and a stable temperature range for $NiSi_2$ is 1000° C. or higher.

From the viewpoint of increasing the proportion of $Ni_2Si$ contained in the metal silicide layer 13, the temperature of the heat treatment for forming the metal silicide layer 13 is preferably 800° C. or lower, more preferably 750° C. or lower, and even more preferably 700° C. or lower.

In the MOSFET of the third embodiment, the concentration distribution of aluminum in the p-well contact region 32 and the metal silicide layer 13 has a peak at the interface (interface X in FIG. 19) between the p-well contact region 32 and the metal silicide layer 13. Therefore, a Schottky barrier between the p-well contact region 32 and the metal silicide layer 13 is lowered, a tunnel current is likely to flow, and the resistance decreases. Accordingly, the contact resistance between the p-well contact region 32 and the source electrode 12 decreases.

When manufacturing the MOSFET of the third embodiment, the excess carbon generated during the heat treatment for forming the metal silicide layer 13 decreases. Therefore, the amount of the carbon-aluminum composite (Al—C pair) formed in the metal silicide layer 13 also decreases. Therefore, it is possible to prevent aluminum in the silicon carbide layer 10 from being sucked out to the metal silicide layer 13. Therefore, the aluminum concentration in the metal silicide layer 13 is considered to be lower than that in the MOSFET 100 of the first embodiment. Further, the aluminum concentration at the interface (interface X in FIG. 19) between the p-well contact region 32 and the metal silicide layer 13 of the MOSFET of the third embodiment is considered to be higher than that in the MOSFET 100 of the first embodiment.

Figure 22:
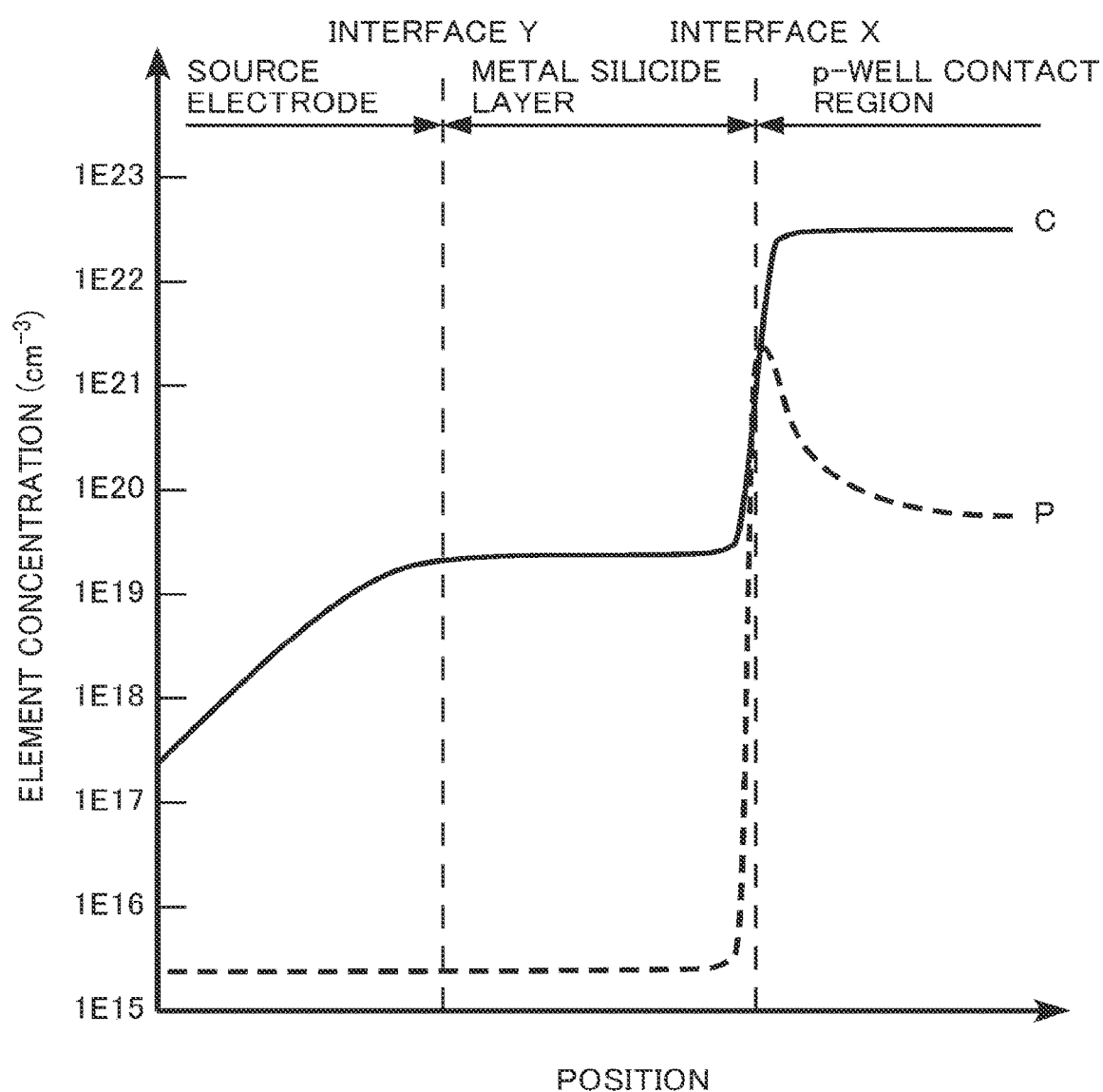
FIG. 22 is a graph illustrating element concentration distributions of the semiconductor device of the first embodiment.

FIG. 22 is a graph illustrating element concentration distributions of the semiconductor device of the first embodiment. FIG. 22 is a graph illustrating the element concentration distributions in the source electrode 12, the metal silicide layer 13, and the source region 30.

The carbon concentration of the metal silicide layer 13 may be $1 \times 10^{18}$ cm$^{-3}$ or more. The carbon concentration of the metal silicide layer 13 may be $1 \times 10^{19}$ cm$^{-3}$ or more.

The carbon concentration of the source electrode 12 may be $1 \times 10^{17}$ cm$^{-3}$ or more. The carbon concentration of the source electrode 12 may be $1 \times 10^{18}$ cm$^{-3}$ or more.

It is considered that the carbon concentration of the source electrode 12 increases as carbons in the metal silicide layer 13 diffuse into the source electrode 12.

The MOSFET of the third embodiment has a smaller amount of the carbon cluster existing at the interface between the source region 30 and the metal silicide layer 13, in the metal silicide layer 13, or at the interface between the metal silicide layer 13 and the source electrode 12 than the MOSFET 100 of the first embodiment. In the MOSFET of the third embodiment, for example, the carbon cluster does not exist. Since the amount of the carbon cluster is small, the carbon concentration in the metal silicide layer 13 is lower than that in the MOSFET 100 of the first embodiment. The carbon concentration in the metal silicide layer 13 of the MOSFET of the third embodiment is, for example, $1 \times 10^{17}$ cm$^{-3}$ or less.

Since the amount of the carbon cluster is small in the MOSFET of the third embodiment, the contact resistance between the source region 30 and the source electrode 12 decreases. Since the amount of carbon clusters is small in the MOSFET of the third embodiment, the possibility of separation between the source region 30 and the metal silicide layer 13 or between the metal silicide layer 13 and the source electrode 12 is reduced.

Since the amount of the carbon cluster is small in the MOSFET of the third embodiment, the contact resistance between the silicon carbide layer 10 and the source electrode 12 decreases. Since the amount of carbon clusters is small in the MOSFET of the third embodiment, the possibility of separation between the silicon carbide layer 10 and the metal silicide layer 13 or between the metal silicide layer 13 and the source electrode 12 is reduced.

As described above, according to the third embodiment, it is possible to implement the semiconductor device capable of reducing the contact resistance between the silicon carbide layer and the metal electrode more than that of the first embodiment. In addition, the possibility of separation between the metal silicide layer and the source electrode is reduced, and it is possible to implement the semiconductor device with higher reliability than that of the first embodiment.

Fourth Embodiment

A semiconductor device of a fourth embodiment differs from that of the first embodiment in that a metal layer is in contact with a silicon carbide layer. In addition, a method for manufacturing the semiconductor device of the fourth embodiment differs from the manufacturing method of the first embodiment in that a metal silicide layer is removed before forming a second metal film. Hereinafter, some of the content overlapping with that in the first embodiment will not be described.

Figure 23:
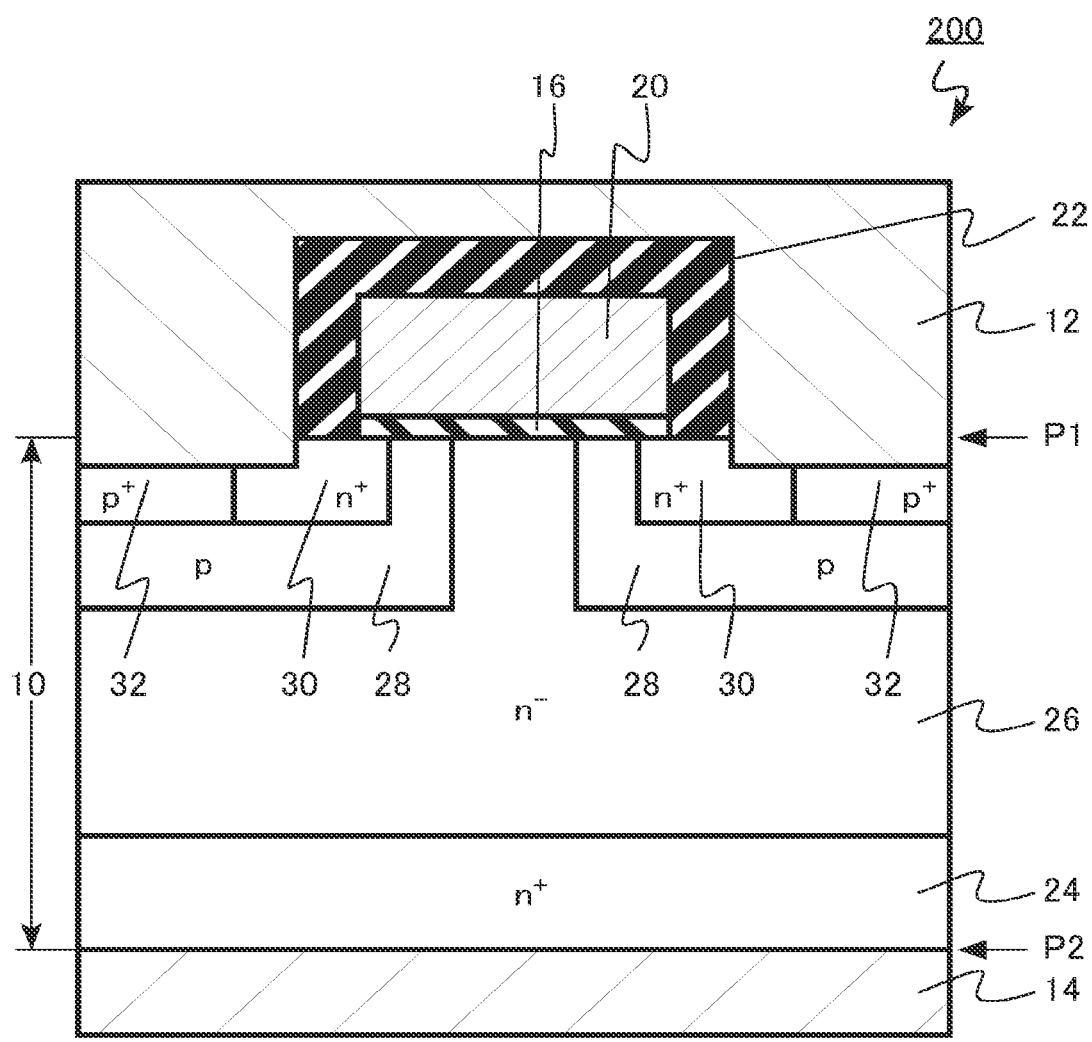
FIG. 23 is a schematic cross-sectional view of a semiconductor device of a fourth embodiment.

FIG. 23 is a schematic cross-sectional view of the semiconductor device of the fourth embodiment. The semiconductor device of the fourth embodiment is a vertical MOSFET 200. The MOSFET 200 is an n-channel transistor that uses electrons as carriers.

The MOSFET 200 includes the silicon carbide layer 10, the source electrode 12 (metal layer), the drain electrode 14, the gate insulating layer 16, the gate electrode 20, and the interlayer insulating layer 22.

The source electrode 12 is an example of the metal layer.

The silicon carbide layer 10 includes a drain region 24, a drift region 26, a p-well region 28, a source region 30 (first silicon carbide region), and a p-well contact region 32 (second silicon carbide region).

The source electrode 12 is positioned on the first plane P1 side of the silicon carbide layer 10. The source electrode 12 is electrically connected to the source region 30 and the p-well contact region 32. The source electrode 12 also functions as a p-well electrode that applies an electric potential to the p-well region 28.

The source electrode 12 is in contact with the silicon carbide layer 10. The source electrode 12 is in contact with the source region 30. The source electrode 12 is in contact with the p-well contact region 32.

The source electrode 12 contains metal. The source electrode 12 is, for example, aluminum, an aluminum alloy, tungsten, or copper.

The source electrode 12 may include, for example, a barrier metal film (not illustrated) between the source electrode 12 and the silicon carbide layer 10. The barrier metal film is, for example, titanium or titanium nitride.

The MOSFET 200 is manufactured by removing the metal silicide layer 13 after the metal silicide layer 13 and before forming the aluminum film 51, for example, in the method for manufacturing the semiconductor device of the MOSFET 100 of the first embodiment. The metal silicide layer 13 is removed by, for example, wet etching.

In the MOSFET 200, a donor concentration of the source region 30 and an acceptor concentration of the p-well contact region 32 are high. Therefore, the contact resistance between the source region 30 and the source electrode 12 is low even if the source region 30 and the source electrode 12 are in direct contact with each other. In addition, the contact resistance between the p-well contact region 32 and the source electrode 12 is low even if the p-well contact region 32 and the source electrode 12 are in direct contact with each other.

Furthermore, it is also possible to remove the carbon cluster formed with the formation of the metal silicide layer 13 at the same time when removing the metal silicide layer 13. Therefore, the contact resistance between silicon carbide layer 10 and source electrode 12 decreases. In addition, there is no possibility that the silicon carbide layer 10 and the source electrode 12 are separated.

As described above, according to the fourth embodiment, it is possible to implement the semiconductor device capable of reducing the contact resistance between the silicon carbide layer and the metal electrode more than that of the first embodiment. In addition, there is no possibility that the source electrode is separated, and it is possible to implement the semiconductor device with higher reliability than that of the first embodiment.

Fifth Embodiment

A semiconductor device of a fifth embodiment differs from the semiconductor device of the first embodiment in that a gate electrode is provided in a trench. Hereinafter, some of the content overlapping with that in the first embodiment will not be described.

Figure 24:
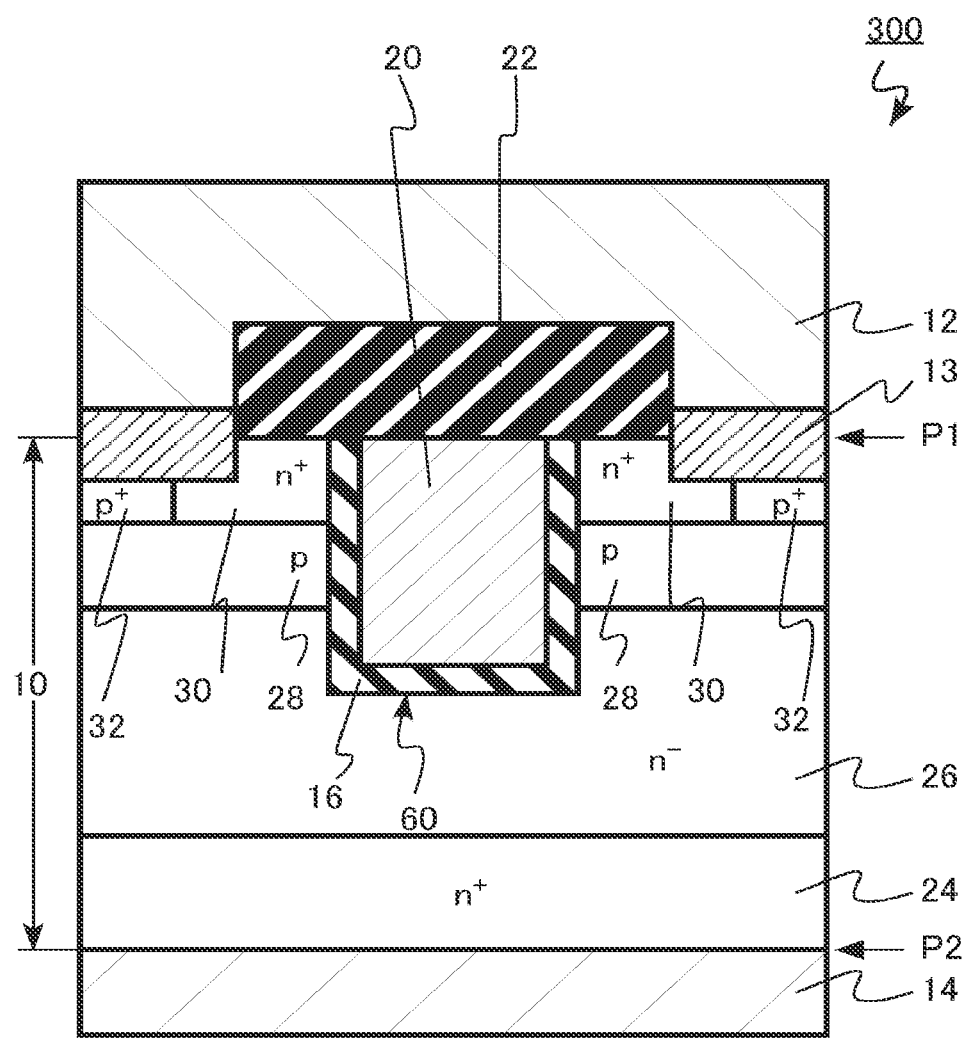
FIG. 24 is a schematic cross-sectional view of a semiconductor device of a fifth embodiment.

FIG. 24 is a schematic cross-sectional view of the semiconductor device of the fifth embodiment. The semiconductor device of the fifth embodiment is a vertical MOSFET 300. The MOSFET 300 is a MOSFET having a trench gate structure in which the gate electrode is provided in the trench. The MOSFET 300 is an n-channel transistor that uses electrons as carriers.

The MOSFET 300 includes the silicon carbide layer 10, the source electrode 12 (metal layer), the metal silicide layer 13 (conductive layer), the drain electrode 14, the gate insulating layer 16, the gate electrode 20, and the interlayer insulating layer 22.

The source electrode 12 is an example of the metal layer. The metal silicide layer 13 is an example of the conductive layer.

The silicon carbide layer 10 includes the drain region 24, the drift region 26, the p-well region 28, the source region 30 (first silicon carbide region), the p-well contact region 32 (second silicon carbide region), and a trench 60.

The trench 60 is provided on the first plane P1 side of the silicon carbide layer 10. A depth of the trench 60 is deeper than a depth of the p-well region 28.

The gate insulating layer 16 is provided in the trench 60. The gate electrode 20 is provided in the trench 60. The gate electrode 20 is provided on the gate insulating layer 16.

In the MOSFET 300 of the fifth embodiment, the trench 60 is formed in the silicon carbide layer 10. The gate insulating layer 16 and the gate electrode 20 are formed in the trench 60. A method for manufacturing the other components is the same as the method for manufacturing the MOSFET 100 of the first embodiment.

According to the MOSFET 300 of the fifth embodiment, the provision of the trench gate structure enables miniaturization, and the on-resistance per unit area can be reduced.

As described above, according to the second embodiment, the semiconductor device capable of reducing the contact resistance between the silicon carbide layer and the metal electrode can be implemented as in the first embodiment. In addition, it is possible to implement the semiconductor device capable of reducing the on-resistance more than that of the first embodiment.

Sixth Embodiment

An inverter circuit and a driving device according to a sixth embodiment correspond to an inverter circuit and a driving device that includes the semiconductor device of the first embodiment.

Figure 25:
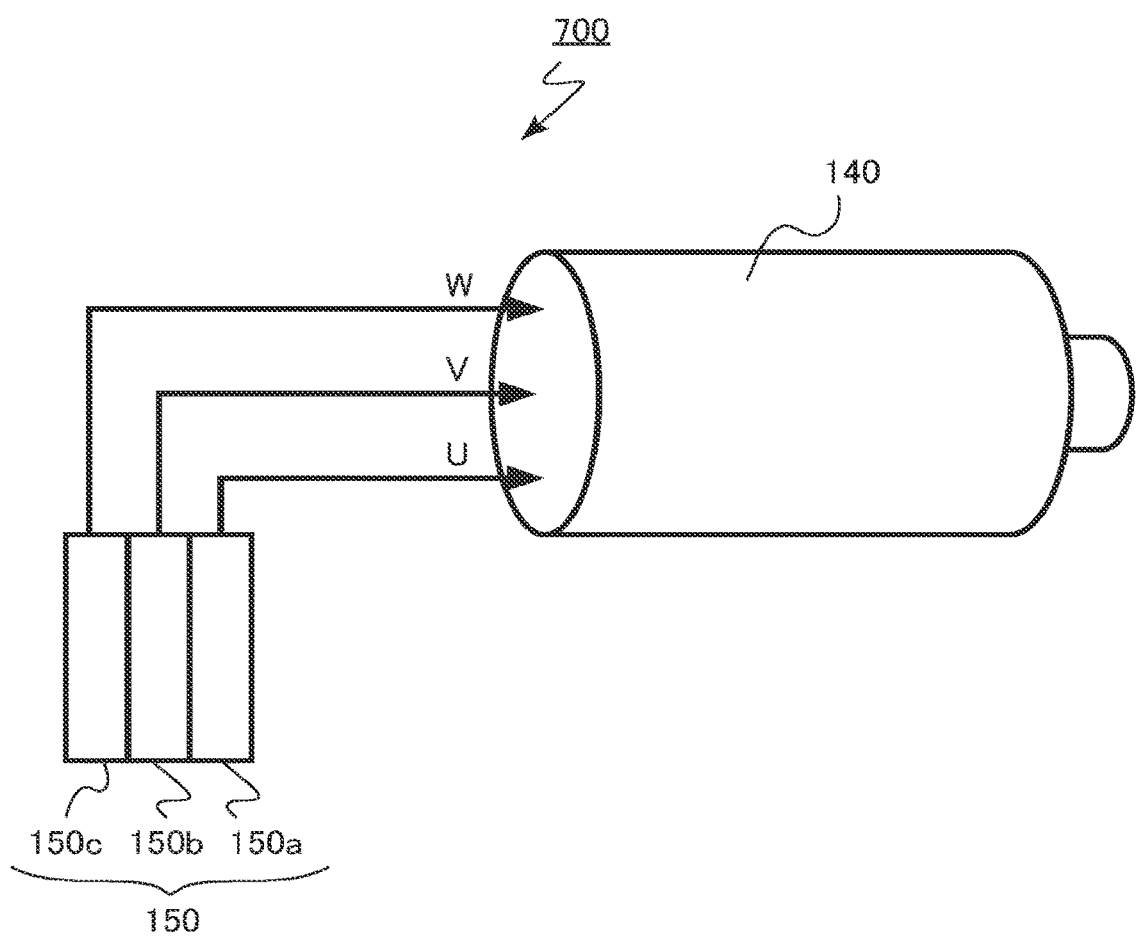
FIG. 25 is a schematic view of a driving device of a sixth embodiment.

FIG. 25 is a schematic view of the driving device of the sixth embodiment. A driving device 700 includes a motor 140 and an inverter circuit 150.

The inverter circuit 150 includes three semiconductor modules 150a, 150b, and 150c using the MOSFET 100 of the first embodiment as a switching element. The three-phase inverter circuit 150 having three AC voltage output terminals U, V, and W is realized by connecting the three semiconductor modules 150a, 150b, and 150c in parallel. The motor 140 is driven by the AC voltage output from the inverter circuit 150.

According to the sixth embodiment, characteristics of the inverter circuit 150 and the driving device 700 are improved by providing the MOSFET 100 with improved characteristics.

Seventh Embodiment

A vehicle of a seventh embodiment is a vehicle including the semiconductor device of the first embodiment.

Figure 26:
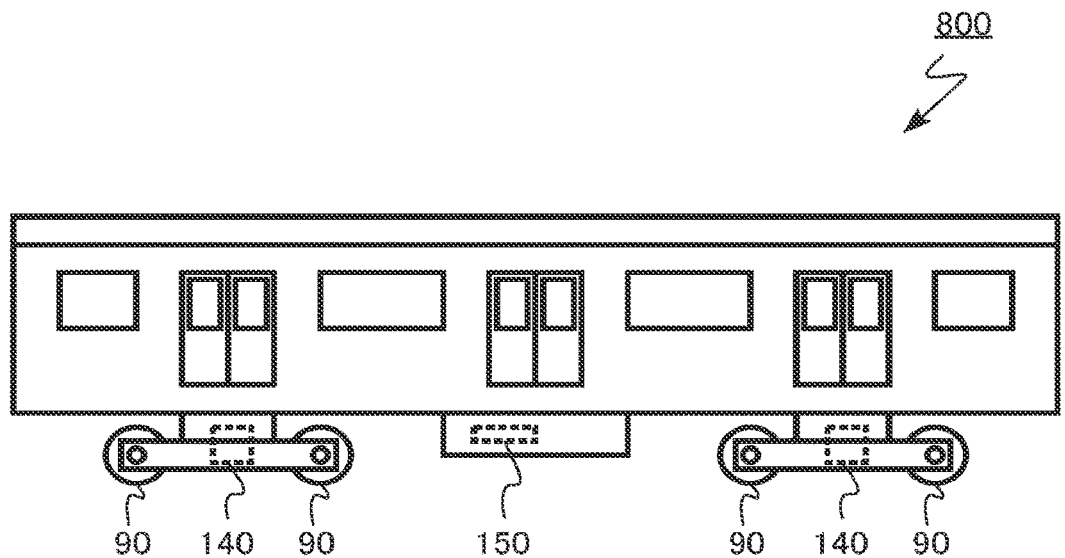
FIG. 26 is a schematic view of a vehicle of a seventh embodiment.

FIG. 26 is a schematic view of the vehicle of the seventh embodiment. A vehicle 800 of the seventh embodiment is a railway vehicle. The vehicle 800 includes a motor 140 and an inverter circuit 150.

The inverter circuit 150 includes three semiconductor modules using the MOSFET 100 of the first embodiment as a switching element. The three-phase inverter circuit 150 having three AC voltage output terminals U, V, and W is realized by connecting the three semiconductor modules in parallel. The motor 140 is driven by the AC voltage output from the inverter circuit 150. Wheels 90 of the vehicle 800 are rotated by the motor 140.

According to the seventh embodiment, characteristics of the vehicle 800 are improved by providing the MOSFET 100 with improved characteristics.

Eighth Embodiment

A vehicle of an eighth embodiment is a vehicle including the semiconductor device of the first embodiment.

Figure 27:
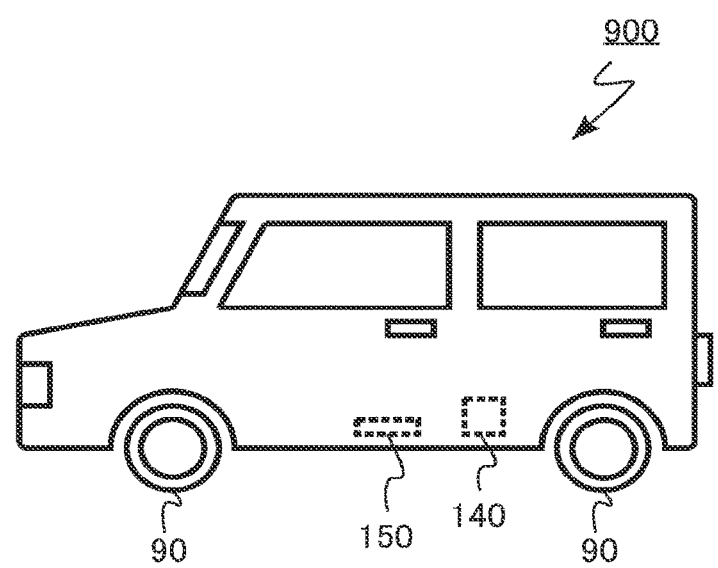
FIG. 27 is a schematic view of a vehicle of an eighth embodiment.

FIG. 27 is a schematic view of the vehicle of the eighth embodiment. A vehicle 900 of the eighth embodiment is a car. The vehicle 900 includes a motor 140 and an inverter circuit 150.

The inverter circuit 150 includes three semiconductor modules using the MOSFET 100 of the first embodiment as a switching element. The three-phase inverter circuit 150 having three AC voltage output terminals U, V, and W is realized by connecting the three semiconductor modules in parallel.

The motor 140 is driven by the AC voltage output from the inverter circuit 150. Wheels 90 of the vehicle 900 are rotated by the motor 140.

According to the eighth embodiment, characteristics of the vehicle 900 are improved by providing the MOSFET 100 with improved characteristics.

Ninth Embodiment

An elevator of a ninth embodiment is an elevator including the semiconductor device of the first embodiment.

Figure 28:
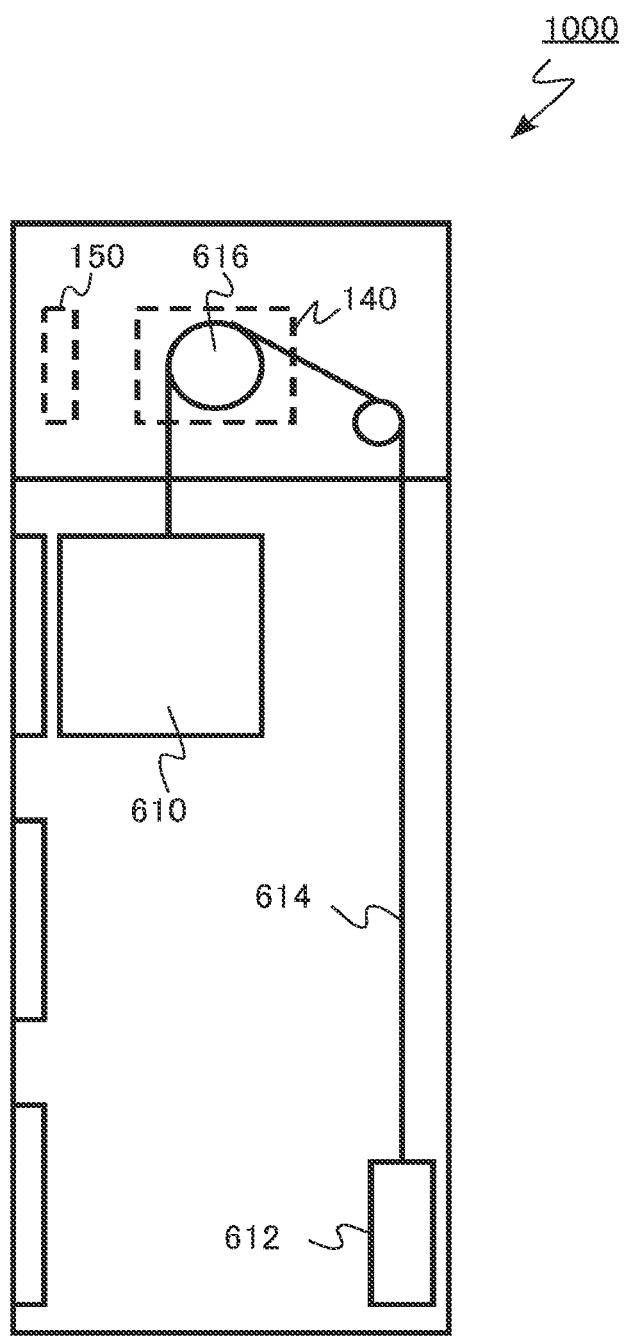
FIG. 28 is a schematic view of an elevator of a ninth embodiment.

FIG. 28 is a schematic view of the elevator of the ninth embodiment. An elevator 1000 of the ninth embodiment includes an elevator car 610, a counterweight 612, a wire rope 614, a hoisting machine 616, a motor 140, and an inverter circuit 150.

The inverter circuit 150 includes three semiconductor modules using the MOSFET 100 of the first embodiment as a switching element. The three-phase inverter circuit 150 having three AC voltage output terminals U, V, and W is realized by connecting the three semiconductor modules in parallel.

The motor 140 is driven by the AC voltage output from the inverter circuit 150. The hoisting machine 616 is rotated by the motor 140 to move the elevator car 610 up and down.

According to the ninth embodiment, characteristics of the elevator 1000 are improved by providing the MOSFET 100 with improved characteristics.

As described above, the description has been given in the first to fifth embodiments by exemplifying the case of 4H-SiC as the crystal structure of silicon carbide, but the present disclosure can also be applied to silicon carbide having another crystal structure of 3C-SiC or 6H-SiC.

In addition, the present disclosure can be applied to other semiconductor devices using silicon carbide such as a diode and an insulated gate bipolar transistor (IGBT).

In addition, the present disclosure can also be applied to not the vertical transistor but a horizontal transistor in which a source electrode and a drain electrode are provided on the same plane of a silicon carbide layer.

Although the case where the n-type impurity is nitrogen or phosphorus has been described as an example in the first to fifth embodiments, arsenic (As) or antimony (Sb) can also be applied as the n-type impurity.

Although the case where the p-type impurity is aluminum has been described as an example in the first to fifth embodiments, boron (B), gallium (Ga) or indium (In) can also be applied as the p-type impurity.

In addition, the case where the source region 30 and the p-well contact region 32 are in contact with each other has been described as an example in the first to fifth embodiments, but the present disclosure can be applied to a semiconductor device in which the source region 30 and the p-well contact region 32 are separated from each other.

In addition, the description has been given in the sixth to ninth embodiments by exemplifying the case where the semiconductor device of the present disclosure is applied to a vehicle or an elevator has been described as an example, but the semiconductor device of the present disclosure can also be applied to, for example, a power conditioner of a photovoltaic power generation system or the like.

Although the case where the semiconductor device of the first embodiment is applied has been described as an example in the sixth to ninth embodiments, the semiconductor devices of the second to fifth embodiments can also be applied, for example.

While certain embodiments have been described, these embodiments have been presented by way of example only, and are not intended to limit the scope of the inventions. Indeed, the semiconductor device, the method for manufacturing the semiconductor device, the inverter circuit, the driving device, the vehicle, and the elevator described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A method for manufacturing a semiconductor device comprising:
   ion-implanting an n-type impurity into a first region of a silicon carbide layer;
   ion-implanting a p-type impurity into a second region of the silicon carbide layer;
   performing a first heat treatment to activate the n-type impurity and the p-type impurity;
   performing a first treatment to increase carbon vacancies in the first region;
   performing a second treatment to decrease carbon vacancies in the second region;
   forming a first metal film on the silicon carbide layer, the first metal film containing one metal element selected from a group consisting of nickel (Ni), palladium (Pd), platinum (Pt), and chromium (Cr);
   performing a second heat treatment to cause the silicon carbide laser to react with the first metal film at a temperatures lower than 900° C. to form a metal silicide layer containing the metal element; and
   forming a second metal film having a chemical composition different from a chemical composition of the first metal film on the silicon carbide layer.

2. The method according to claim 1, wherein the first treatment is an ion implantation of argon (Ar) into the first region.

3. The method according to claim 2, wherein the argon is ion-implanted into the first region before the performing the first heat treatment.

4. The method according to claim 1, wherein
the first treatment is an irradiation of electron beam to the first region.
5. The method according to claim 1, wherein
the second treatment is an ion implantation of carbon (C) into the second region.
6. The method according to claim 1, wherein
the second treatment is an exposure of the second region to an atmosphere containing a methane gas.
7. The method according to claim 1, wherein
the second heat treatment is performed in an atmosphere containing at least any one of carbon dioxide and atomic hydrogen.
8. The method according to claim 1. further comprising
removing the metal silicide layer before the forming the second metal film.
9. The method according to claim 4, wherein
the first treatment is performed before the performing the first heat treatment.
10. The method according to claim 5, wherein
the second treatment is performed before the performing the first heat treatment.
11. The method according to claim 6, wherein
the second treatment is performed before the performing the first heat treatment.

\* \* \* \* \*